United States Patent
Masumoto

(10) Patent No.: US 9,590,071 B2
(45) Date of Patent: Mar. 7, 2017

(54) MANUFACTURING METHOD OF SEMICONDUCTOR DEVICE AND SEMICONDUCTOR DEVICE

(71) Applicant: Renesas Electronics Corporation, Koutou-ku, Tokyo (JP)

(72) Inventor: Ichiro Masumoto, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/995,662

(22) Filed: Jan. 14, 2016

(65) Prior Publication Data

US 2016/0233311 A1 Aug. 11, 2016

(30) Foreign Application Priority Data

Feb. 10, 2015 (JP) ................... 2015-024395

(51) Int. Cl.
    *H01L 29/20* (2006.01)
    *H01L 29/66* (2006.01)
    *H01L 21/311* (2006.01)
    *H01L 21/28* (2006.01)
    (Continued)

(52) U.S. Cl.
CPC .. *H01L 29/66522* (2013.01); *H01L 21/28264* (2013.01); *H01L 21/31111* (2013.01); *H01L 29/4236* (2013.01); *H01L 29/66462* (2013.01); *H01L 29/7786* (2013.01); *H01L 29/2003* (2013.01); *H01L 29/4238* (2013.01); *H01L 29/42376* (2013.01)

(58) Field of Classification Search
None
See application file for complete search history.

(56) References Cited

U.S. PATENT DOCUMENTS

2010/0025730 A1* 2/2010 Heikman ............ H01L 29/7787
    257/194
2015/0270355 A1* 9/2015 Kuraguchi ............ H01L 29/778
    257/194

FOREIGN PATENT DOCUMENTS

JP     2008-153330 A    7/2008
JP     2011-082415 A    4/2011

OTHER PUBLICATIONS

Ting-En Hsieh et al., "Gate Recessed Quasi-Normally OFF Al2O3/AlGaN/GaN MIS-HEMT With Low Threshold Voltage Hysteresis Using PEALD AlN Interfacial Passivation Layer", IEEE Electron Device Letters, Jul. 2014, pp. 732-734, vol. 35, No. 7.

* cited by examiner

*Primary Examiner* — Charles Garber
*Assistant Examiner* — Alia Sabur
(74) *Attorney, Agent, or Firm* — Sughrue Mion, PLLC

(57) ABSTRACT

The characteristics of a semiconductor device using a nitride semiconductor are improved.

A trench which penetrates an insulating film and a barrier layer and reaches inside of a channel layer is formed by etching the channel layer, the barrier layer, and the insulating film which are formed over a substrate. Then, an epitaxial regrowth layer is formed over a bottom surface and a side surface of the trench by using an epitaxial growth method. It is possible to reduce roughness (unevenness) of a crystal surface due to etching and the like of the bottom surface and the side surface of the trench by forming the epitaxial regrowth layer in this way. A channel is formed in an interface between the epitaxial regrowth layer and a gate insulating film, so that mobility of carriers improves and on-resistance of an element decreases.

13 Claims, 26 Drawing Sheets

(51) Int. Cl.
*H01L 29/423* (2006.01)
*H01L 29/778* (2006.01)

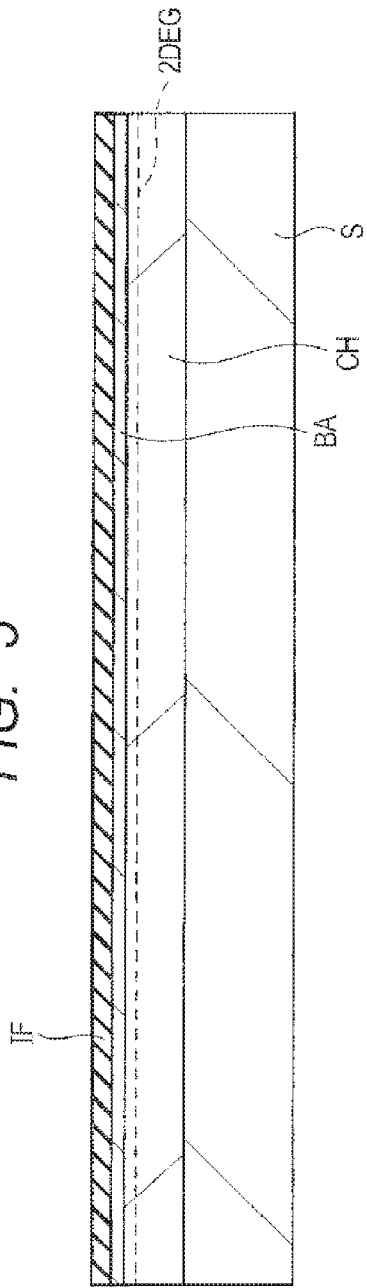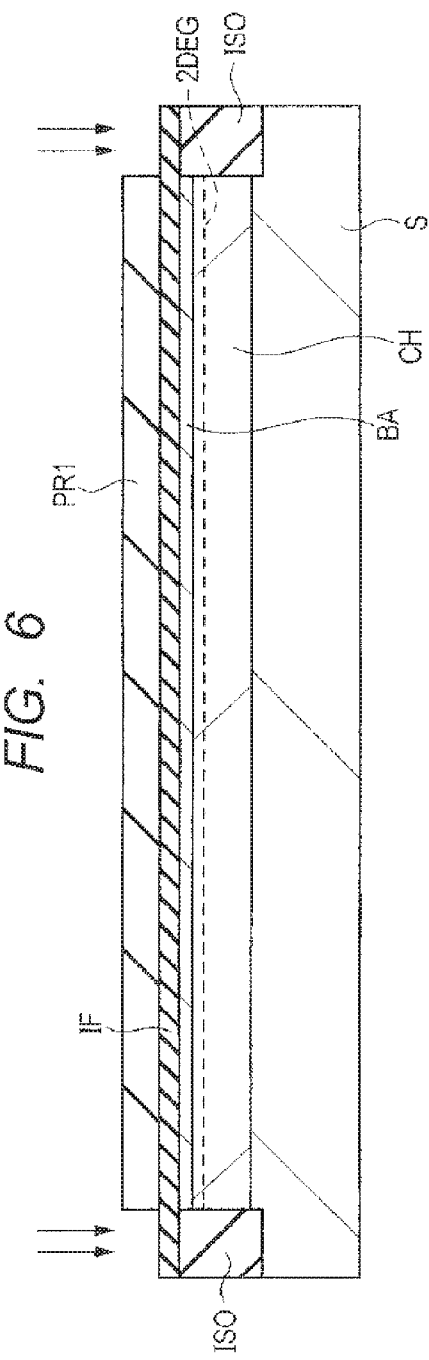

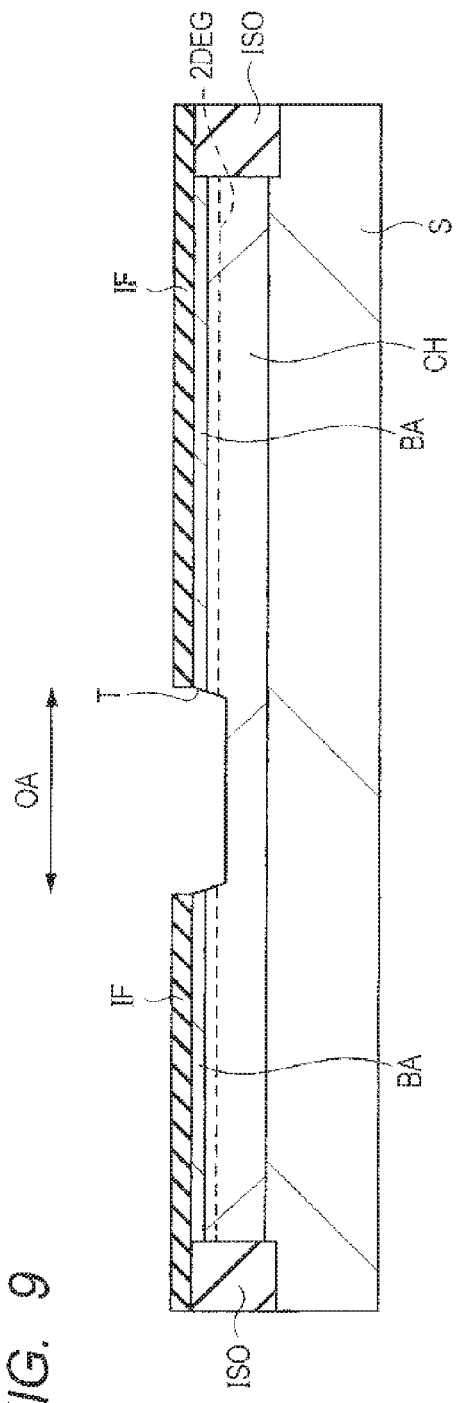
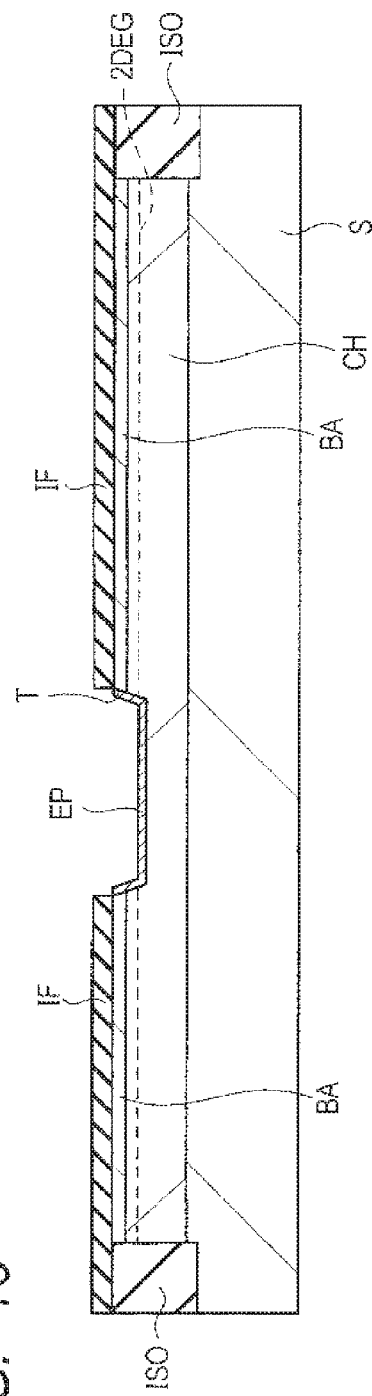

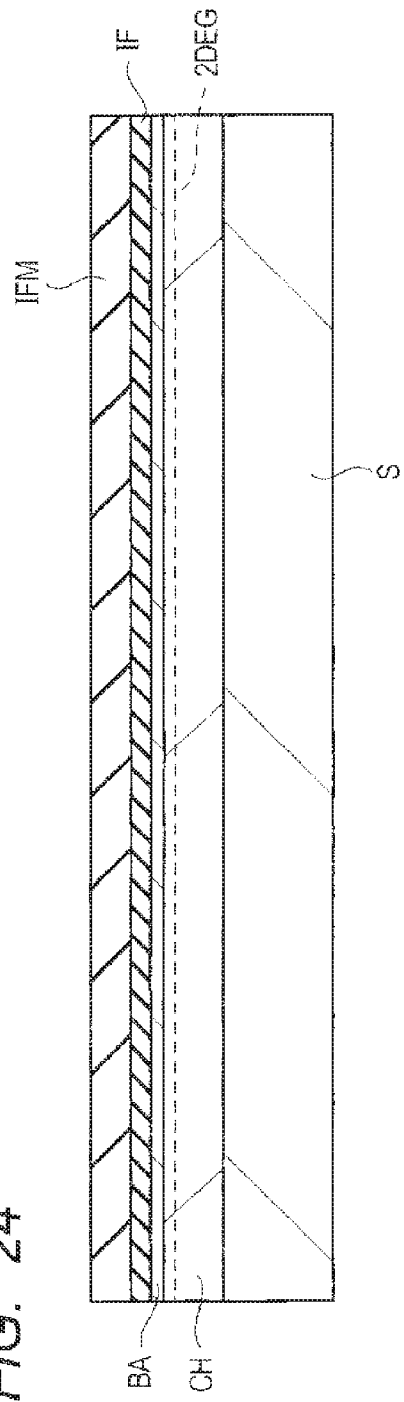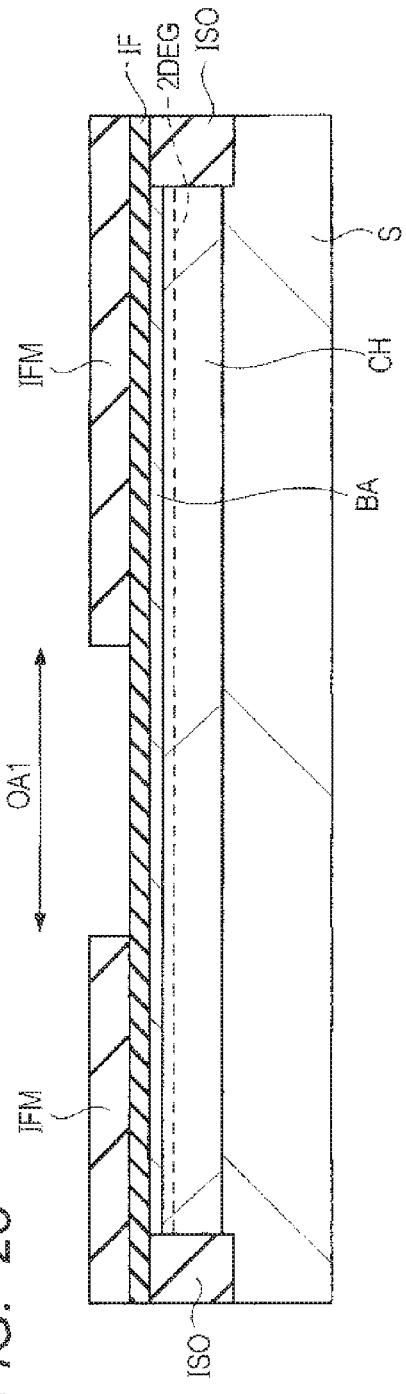

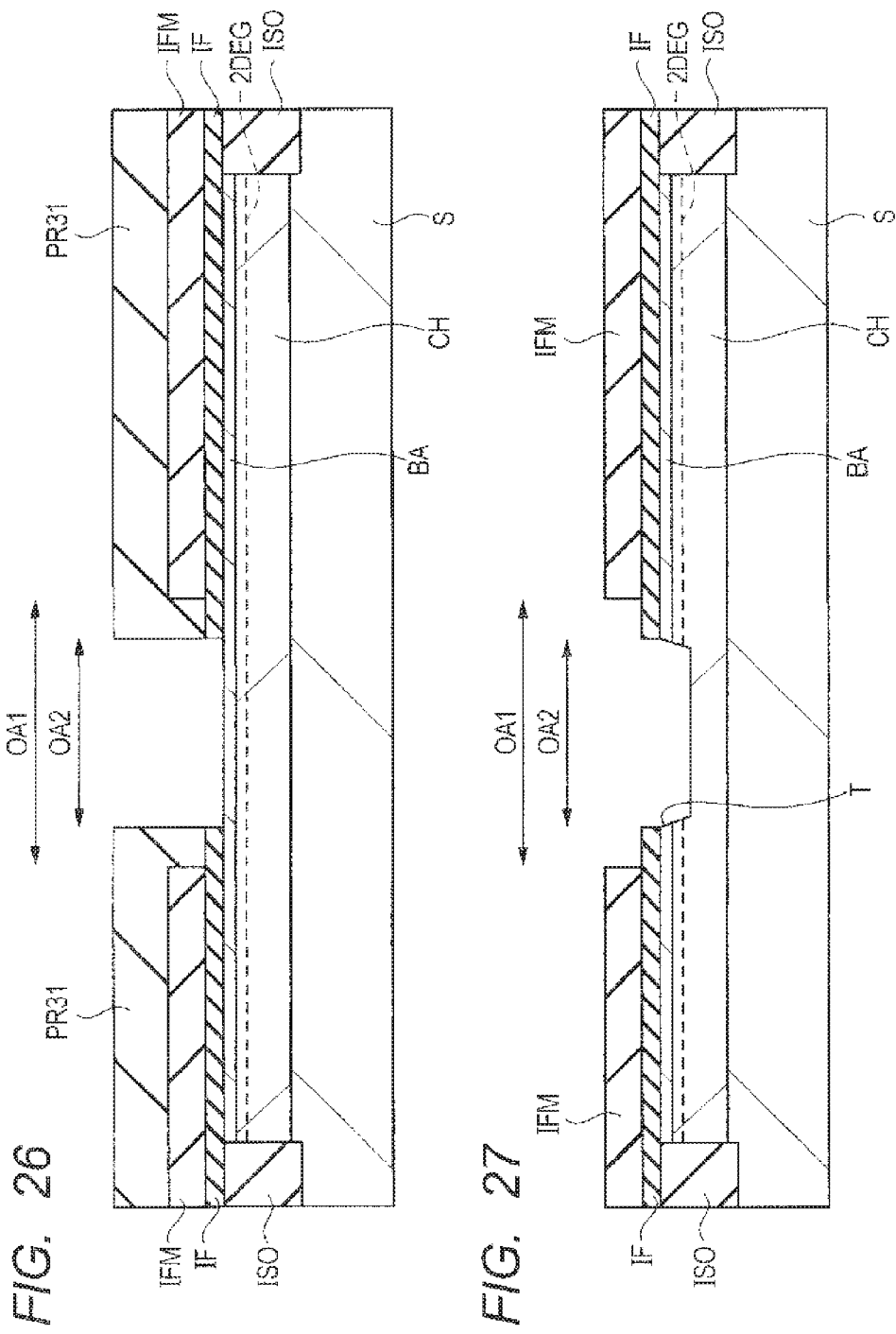

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2015-024395 filed on Feb. 10, 2015 including the specification, drawings and abstract is incorporated herein by reference in its entirety.

BACKGROUND

The present invention relates to a manufacturing method of a semiconductor device and a semiconductor device. For example, the present invention can be preferably used for a semiconductor device that uses a nitride semiconductor.

In recent years, a semiconductor device using group III-V compounds having a band gap greater than that of Si is attracting attention. Among them, a semiconductor device which is a power MISFET (Metal Insulator Semiconductor Field Effect Transistor) using gallium nitride and which can perform normally-off operation is being developed.

For example, Japanese Unexamined Patent Application Publication No. 2011-82415 discloses a group-III nitride-based field-effect transistor including a nitride semiconductor film formed over a recessed region, an insulating film formed on an inner wall surface and the like of the recessed region, and a gate electrode formed over the insulating film.

Further, Japanese Unexamined Patent Application Publication No. 2008-153330 discloses a nitride semiconductor high electron mobility transistor including an i-GaN selective regrowth layer deposited to an inner wall surface of a recessed portion and a gate electrode that is buried in the recessed portion through the i-GaN selective regrowth layer.

Further, IEEE ELECTRON DEVICE LETTERS, VOL. 35, NO. 7, July 2014 discloses MIS-HEMT where a 2 nm AlN layer is formed before growing an $Al_2O_3$ layer over a recess

SUMMARY

The inventors are engaged in research and development of a semiconductor device using the nitride semiconductor as described above and intensively study about improvement of characteristics of a normally-off type semiconductor device. In the process of the study, it is found that there is room for further improvement of characteristics of a semiconductor device that uses a nitride semiconductor.

The other purposes and the new features will become clear from the description of the present specification and the accompanying drawings.

The following briefly explains the outline of typical embodiments among the embodiments disclosed in the present application.

A manufacturing method of a semiconductor device described in an embodiment disclosed in the present application includes a process to form a third nitride semiconductor layer over a side surface and a bottom surface of a trench which penetrates an insulating film and a second nitride semiconductor layer and reaches inside of a first nitride semiconductor layer by using an epitaxial growth method.

A semiconductor device described in an embodiment disclosed in the present application includes a third nitride semiconductor layer formed over a side surface and a bottom surface of a trench which penetrates an insulating film and a second nitride semiconductor layer and reaches inside of a first nitride semiconductor layer. The third nitride semiconductor layer is an epitaxial growth layer.

According to a manufacturing method of a semiconductor device described in a typical embodiment which is disclosed in the present application and is described below, it is possible to manufacture a semiconductor device having excellent characteristics.

According to a semiconductor device described in a typical embodiment which is disclosed in the present application and is described below, it is possible to improve characteristics of a semiconductor device.

BRIEF DESCRIPTION OF THE DRAWINGS

FIG. 5 is a cross-sectional view showing a manufacturing process of the semiconductor device of the first embodiment.

FIG. 6 is a cross-sectional view showing a manufacturing process of the semiconductor device of the first embodiment and is a cross-sectional view showing a manufacturing process following that in FIG. 5.

FIG. 9 is a cross-sectional view showing a manufacturing process of the semiconductor device of the first embodiment and is a cross-sectional view showing a manufacturing process following that in FIG. 8.

FIG. 10 is a cross-sectional view showing a manufacturing process of the semiconductor device of the first embodiment and is a cross-sectional view showing a manufacturing process following that in FIG. 9.

FIG. 24 is a cross-sectional view showing a manufacturing process of the semiconductor device of the third embodiment.

FIG. 25 is a cross-sectional view showing a manufacturing process of the semiconductor device of the second embodiment and is a cross-sectional view showing a manufacturing process following that in FIG. 24.

FIG. 26 is a cross-sectional view showing a manufacturing process of the semiconductor device of the second embodiment and is a cross-sectional view showing a manufacturing process following that in FIG. 25.

FIG. 27 is a cross-sectional view showing a manufacturing process of the semiconductor device of the second embodiment and is a cross-sectional view showing a manufacturing process following that in FIG. 26.

DETAILED DESCRIPTION

Figure 1:
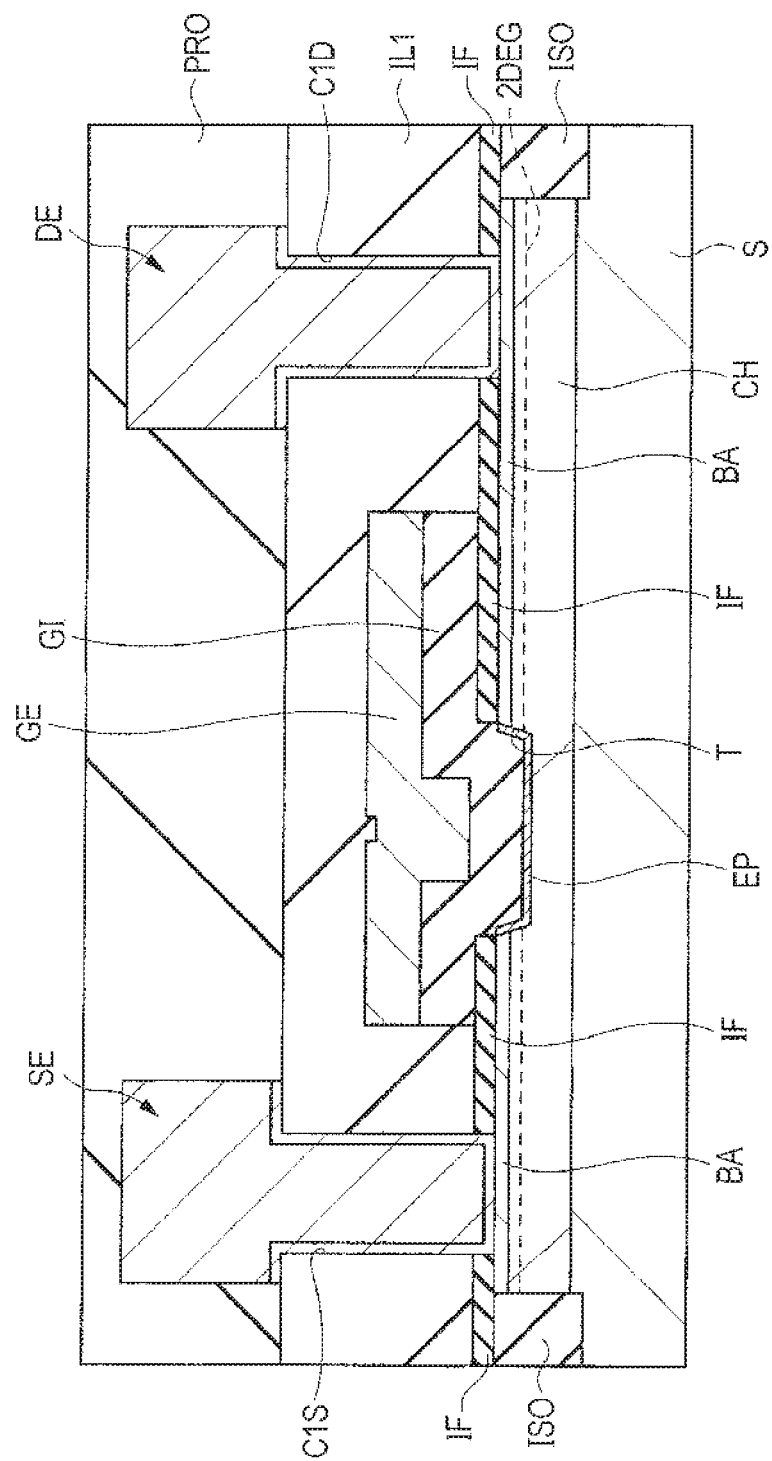
FIG. 1 is a cross-sectional view showing a configuration of a semiconductor device of a first embodiment.

The following embodiments will be explained, divided into plural sections or embodiments, if necessary for convenience. Except for the case where it shows clearly in particular, they are not mutually unrelated and one has relationships such as a modification, an application, detailed explanation, and supplementary explanation of some or entire of another. In the following embodiment, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiment, an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the number of elements, etc. (including the number, a numeric value, an amount, a range, etc.).

Hereinafter, the embodiments will be described in detail with reference to the drawings. In all the drawings for explaining embodiments, the same symbol or a related symbol is attached to members having the same function, and the repeated explanation thereof is omitted. When there is a plurality of similar members (regions), an individual or a specific region may be represented by adding a sign to a generic symbol. In the embodiments described below, in principle, the same or similar component will not be repeatedly described unless otherwise required.

In the drawings used in the embodiment, hatching may be omitted even in a cross-sectional view so as to make the drawings easy to see.

In cross-sectional views and plan views, the size of each region does not correspond to that in an actual device, and a specific region may be shown in a relatively large size in order to make the drawings easy to understand. When a cross-sectional view and a plan view correspond to each other, a specific region may be shown in a relatively large size in order to make the drawings easy to understand.

First Embodiment

Hereinafter, a semiconductor device of the present embodiment will be described in detail with reference to the drawings.

Description of Structure

Figure 2:
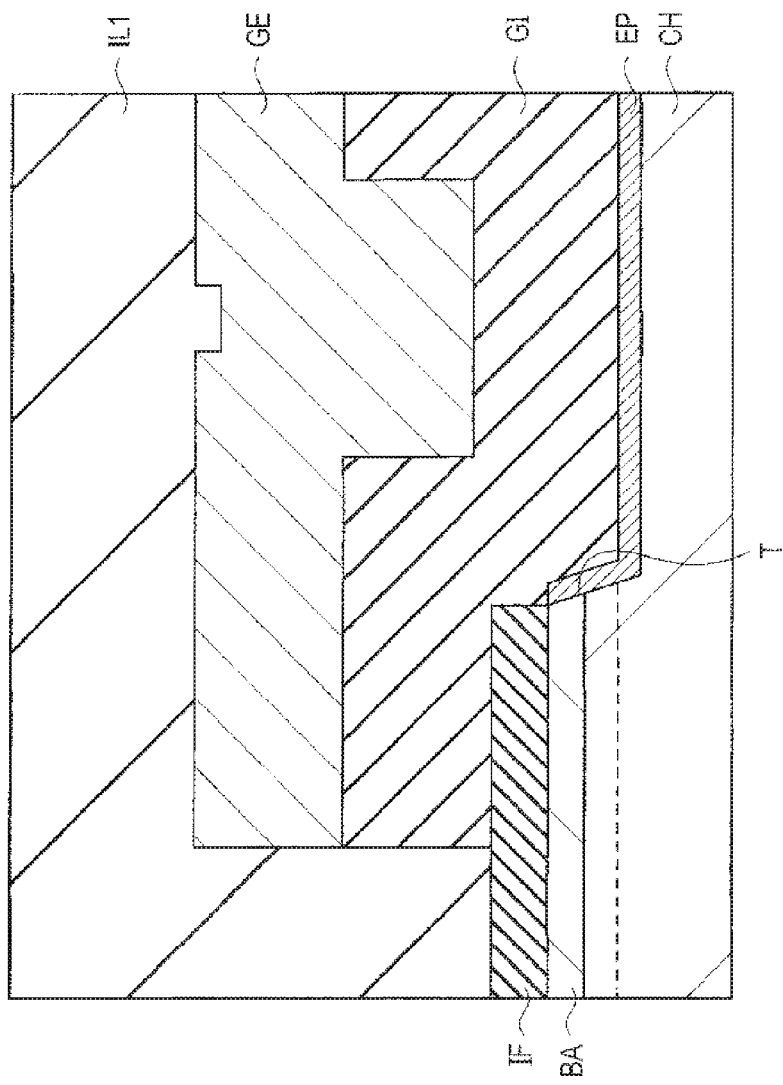
FIG. 2 is a cross-sectional view showing a configuration of a portion near a trench portion of the semiconductor device of the first embodiment.
Figure 3:
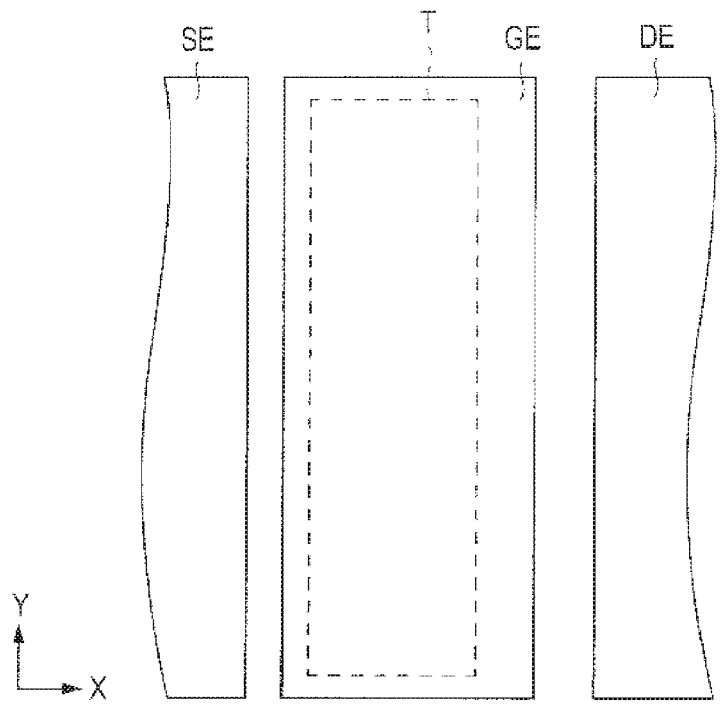
FIG. 3 is a plan view showing a configuration of the semiconductor device of the first embodiment.
Figure 4:
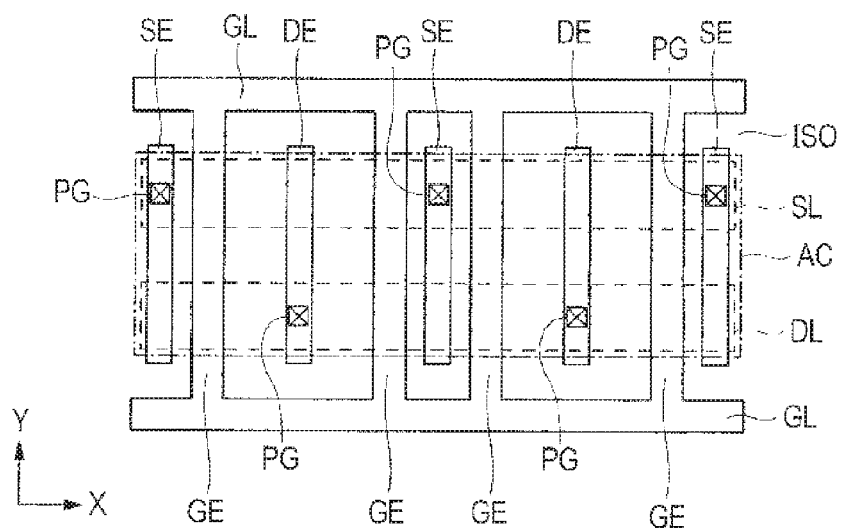
FIG. 4 is a plan view showing a configuration of the semiconductor device of the first embodiment.

FIG. 1 is a cross-sectional view showing a configuration of the semiconductor device of the present embodiment. FIG. 2 is a cross-sectional view showing a configuration of a portion near a trench portion of the semiconductor device of the present embodiment. FIGS. 3 and 4 are plan views showing a configuration of the semiconductor device of the present embodiment. The cross-sectional view of FIG. 1 corresponds to, for example, a cross-section in an X direction in FIG. 3.

The semiconductor device (semiconductor element, element) of the present embodiment is a MIS (Metal Insulator Semiconductor) type field effect transistor (FET) using a nitride semiconductor. The semiconductor device is also referred to as a high electron mobility transistor (HEMT) or a power transistor. The semiconductor device of the present embodiment is a so-called recess gate type semiconductor device.

In the semiconductor device of the present embodiment, as shown in FIG. 1, a channel layer CH and a barrier layer BA are formed in order over a substrate S. An insulating film IF is formed over the barrier layer BA. An active region AC where a transistor is formed is partitioned by an element isolation region ISO (see FIG. 4).

A gate electrode GE is formed inside a trench T, which penetrates the insulating film IF and the barrier layer BA and reaches the inside of the channel layer CH, through a gate insulating film GI. The channel layer CH and the barrier layer BA is formed of a nitride semiconductor. The barrier layer BA is a nitride semiconductor whose electron affinity is smaller than that of the channel layer CH. In other words, the barrier layer BA is a nitride semiconductor whose band gap is greater than that of the channel layer CH.

A two-dimensional electron gas 2DEG is generated in a portion of the channel layer CH near an interface between the channel layer CH and the barrier layer BA.

The two-dimensional electron gas 2DEG is generated through a mechanism described below. The nitride semiconductors (here, gallium-nitride-based semiconductors) that form the channel layer CH and the barrier layer BA respectively have band gaps (forbidden band widths) different from each other and electron affinities different from each other. Therefore, a triangular well potential is generated on a bonded surface between these semiconductors. Electrons are accumulated in the triangular well potential, so that the two-dimensional electron gas 2DEG is generated near the interface between the channel layer CH and the barrier layer BA.

Here, the two-dimensional electron gas 2DEG that is formed near the interface between the channel layer CH and the barrier layer BA is divided by the trench T in which the gate electrode GE is formed. Therefore, in the semiconductor device of the present embodiment, when a threshold voltage is not applied to the gate electrode GE, it is possible to maintain an off state, and when the threshold voltage is applied to the gate electrode GE, a channel is formed near a bottom surface of the trench T and it is possible to maintain an on state. In this way, it is possible to perform a normally-off operation.

Here, in the present embodiment, an epitaxial regrowth layer EP is formed on the bottom surface (bottom portion) and a side surface (side portion) of the trench T. The epitaxial regrowth layer EP is formed of a nitride semiconductor formed by an epitaxial growth method.

The epitaxial regrowth layer EP is provided on the bottom surface and the side surface of the trench T in this way, so that roughness (unevenness) of a crystal surface of the bottom surface and the side surface of the trench T is reduced and it is possible to improve flatness of the interface between the gate insulating film GI and the epitaxial regrowth layer EP. Therefore, it is possible to suppress deterioration of mobility of carriers (here, electrons) moving through a channel formed on the bottom surface and the side surface of the trench T.

Further, the epitaxial regrowth layer EP is formed in addition to the channel layer CH, so that, as described later, it is possible to reduce influence of trap and improve characteristics of the semiconductor device.

The configuration of the semiconductor device of the present embodiment will be described in further detail. As shown in FIG. 1, in the semiconductor device of the present embodiment, the channel layer CH formed of a nitride semiconductor is formed over the substrate S and the barrier layer BA formed of a nitride semiconductor is formed over the channel layer CH. Between the substrate S and the channel layer CH, a nucleation layer, a strain relaxing layer, a buffer layer, and the like may be provided in order from the substrate S. These layers are formed of a nitride semiconductor. The nucleation layer is formed in order to generate crystal nuclei used when a layer formed above the nucleation layer, such as the strain relaxing layer, grows. Further, the nucleation layer is formed in order to prevent constituent elements (for example, Ga and the like) of the layer formed above from diffusing into the substrate S from the layer formed above and to prevent the substrate S from changing in quality. The strain relaxing layer is formed in order to reduce stress applied to the substrate S to prevent warps and cracks from occurring in the substrate S. The buffer layer is formed in order to raise the threshold voltage. Specifically, when the buffer layer is provided below the channel layer CH, polarization charge (negative fixed charge) is generated in a portion of the buffer layer near the interface between the channel layer CH and the buffer layer, and a conduction band is raised by the polarization charge. Thereby, it is possible to raise the threshold voltage to a positive side and to improve normally-off operability.

The gate electrode GE penetrates the insulating film IF and the barrier layer BA and is formed inside the trench (also referred to as a recess) T, which is formed by digging part of the channel layer CH, through the epitaxial regrowth layer EP and the gate insulating film GI.

Figure 7:
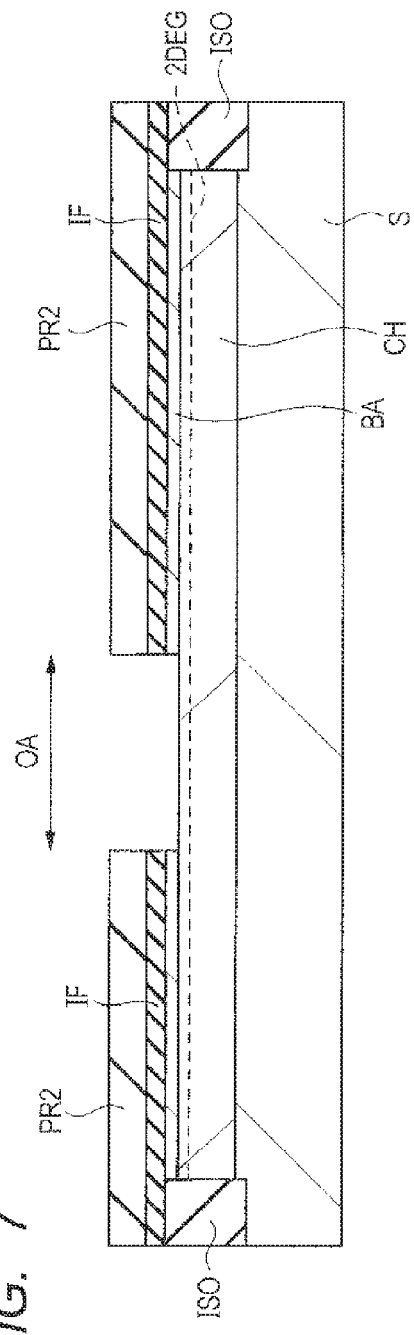
FIG. 7 is a cross-sectional view showing a manufacturing process of the semiconductor device of the first embodiment and is a cross-sectional view showing a manufacturing process following that in FIG. 6.

Specifically, the insulating film IF has an opening portion in an opening region (OA) (see FIG. 7). The trench T is formed corresponding to the opening portion. The channel layer CH is exposed from the bottom surface of the trench T. Further, the channel layer CH is exposed from a lower portion of the side surface of the trench T, and the barrier layer BA is exposed from an upper portion of the side surface of the trench T.

The epitaxial regrowth layer EP (also referred to as simply an epitaxial growth layer) is formed on the bottom surface and the side surface of the trench T.

Further, the gate insulating film GI is formed inside the groove T and over the insulating film IF. In other words, in a region where the trench T is formed, the gate insulating film GI is formed over the epitaxial regrowth layer EP, and in a region where the trench T is not formed, the gate insulating film GI is formed over the insulating film IF.

The gate electrode GE is formed over the gate insulating film GI. The shape of the gate electrode GE as seen from above (hereinafter referred to as a planar shape) is, for example, a rectangular shape (see FIG. 3). Here, the gate insulating film GI and the gate electrode GE have the same planer shape.

The gate electrode GE has a shape projecting in one direction (in FIG. 1, toward the right, toward the drain electrode DE). The projecting portion is called a field plate electrode. The field plate electrode is a partial region of the gate electrode GE extending from an end portion of the trench T facing the drain electrode DE toward the drain electrode DE.

Further, the gate electrode GE extends from an end portion of the trench T facing the source electrode SE toward the source electrode SE. The insulating film IF is arranged below a portion of the gate electrode projecting (extending) toward the drain electrode DE or the source electrode SE.

The source electrode SE and the drain electrode DE are formed over the barrier layer BA on both sides of the gate electrode GE. The barrier layer BA and the source electrode SE are ohmic-coupled to each other through an ohmic layer. Further, the barrier layer BA and the drain electrode DE are ohmic-coupled to each other through an ohmic layer. The source electrode SE includes a coupling portion located in a contact hole C1S formed in an interlayer insulating film IL1 and a wiring portion over the coupling portion. The drain electrode DE includes a coupling portion located in a contact hole C1D formed in the interlayer insulating film IL1 and a wiring portion over the coupling portion. The source electrode SE and the drain electrode DE are covered by a protective insulating film PRO. The planar shapes of the source electrode SE and the drain electrode DE are, for example, a rectangular shape (see FIGS. 3 and 4).

Although the layout of the gate electrode GE, the source electrode SE, and the drain electrode DE is not limited, these electrodes are arranged, for example, as shown in FIG. 4. The gate electrode GE, the source electrode SE, and the drain electrode DE are arranged over an active region AC having a rectangular shape having a long side in the X direction. The active region AC is surrounded and partitioned by the element isolation region ISO.

As described above, the source electrode SE and the drain electrode DE have a rectangular shape having a long side in the Y direction. The source electrodes SE and the drain electrodes DE are arranged alternately in the X direction. The gate electrode GE is arranged between the source electrode SE and the drain electrode DE. For example, one end portion of a plurality of gate electrodes GE (upper side in FIG. 4) is coupled to a gate line GL extending in the X direction. Further, one end portion of a plurality of gate electrodes GE (lower side in FIG. 4) is coupled to a gate line GL extending in the X direction. Either one of the two gate lines GL may be omitted, and the total shape of the source electrodes SE and the drain electrodes DE may be a comb teeth shape. The plurality of source electrodes SE are coupled to a source line SL extending in the X direction through plugs PG. The plurality of drain electrodes DE are coupled to a drain line DL extending in the X direction through plugs (coupling portions) PG. In FIG. 1, layers higher than the interlayer insulating film IL1, for example, the plugs PG, the source line SL, and the drain line DL, are omitted.

Description of Manufacturing Method

Next, the manufacturing method of the semiconductor device of the present embodiment will be described and the configuration of the semiconductor device will be further clarified with reference to FIGS. 5 to 17. FIGS. 5 to 17 are cross-sectional views showing a manufacturing process of the semiconductor device of the present embodiment.

As shown in FIG. 5, the channel layer CH is formed over the substrate S. As the substrate S, for example, a semiconductor substrate formed of silicon (Si) whose resistivity is 1 Ω·cm and whose surface (111) is exposed is used, and over the substrate S, as the channel layer CH, a gallium nitride (GaN) layer is heteroepitaxially grown by using a metal organic chemical vapor deposition (MOCVD) method or the like. The metal organic chemical vapor deposition method is also referred to as a MOVPE (Metal Organic Vapor Phase Epitaxy) method. The film thickness of the channel layer CH is, for example, about 50 nm.

As the substrate S, it is also possible to use a substrate formed of SiC, sapphire, or the like in addition to the substrate formed of silicon described above. Further, it is also possible to use a bulk substrate of a nitride semiconductor (for example, a bulk substrate of GaN). Between the substrate S and the channel layer CH, a nucleation layer, a strain relaxing layer, and a buffer layer may be provided in order from the substrate S. For example, an aluminum nitride (AlN) layer is used as the nucleation layer, a superlattice structure in which a laminated film (an AlN/GaN film) of a gallium nitride (GaN) layer and an aluminum nitride (AlN) layer is repeatedly stacked is used as the strain relaxing layer, and an AlGaN layer or the like is used as the buffer layer. These layers can be formed by using the metal organic chemical vapor deposition method or the like.

Subsequently, over the channel layer CH, as the barrier layer BA, for example, AlGaN ($Al_xGa_{(1-x)}N$ layer) is heteroepitaxially grown by using the metal organic chemical vapor deposition method or the like. The film thickness of the AlGaN layer is, for example, about 15 nm. The composition of Al is, for example, about 20%.

In this way, the laminated body of the channel layer CH and the barrier layer BA is formed. The laminated body is formed by the heteroepitaxial growth described above, that is, group III surface growth in which the layers are laminated in a [0001] crystal axis (C axis) direction. In other words, the laminated body described above is formed by (0001) Ga surface growth. In the laminated body, the two-dimensional electron gas 2DEG is generated near the interface between the channel layer CH and the barrier layer BA.

Subsequently, the insulating film IF is formed over the barrier layer BA as a cover film. For example, as the insulating film IF, a silicon nitride film (a SiN film) is deposited over the barrier layer BA by using a CVD (Chemical Vapor Deposition) method or the like. The film thickness of the insulating film IF is, for example, about 100 nm.

Subsequently, as shown in FIG. 6, a photoresist film PR1 that opens an element isolation region is formed over the insulating film IF by using a photolithography technique. Subsequently, boron (B) or nitrogen (N) is implanted by using the photoresist film PR1 as a mask. The boron (B) or the nitrogen (N) is injected into the channel layer CH and the barrier layer BA through the insulating film IF. Ion species such as the boron (B) or the nitrogen (N) are implanted into the channel layer CH and the barrier layer BA in this way, so that the state of the crystal changes and the resistance of the crystal increases. The element isolation region ISO is formed in this way. Thereafter, the photoresist film PR1 is removed. A region surrounded by the element isolation region ISO becomes the active region AC (see FIG. 4).

Subsequently, as shown in FIG. 7, a photoresist film PR2 having an opening portion in an opening region OA is formed over the insulating film IF by using a photolithography technique. The width of the opening region OA is, for example, about 1 μm. Subsequently, the insulating film IF is etched by using the photoresist film PR2 as a mask. A process to change a material in a lower layer into a desired shape by performing etching by using a photoresist film processed into a desired shape by photolithography (exposure, development) or a hard mask film as a mask is called patterning. Thereby, the insulating film IF having an opening portion in the opening region OA is formed over the barrier layer BA. In other words, the barrier layer BA is exposed in the opening region OA.

Figure 8:
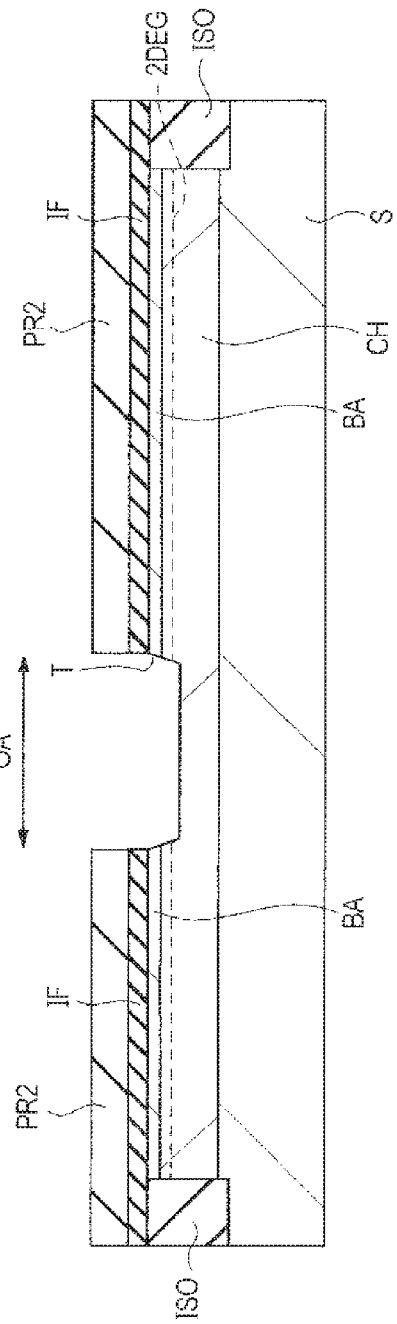
FIG. 8 is a cross-sectional view showing a manufacturing process of the semiconductor device of the first embodiment and is a cross-sectional view showing a manufacturing process following that in FIG. 7.

Subsequently, as shown in FIG. 8, the trench T which penetrates the insulating film IF and the barrier layer BA and reaches inside of the channel layer CH is formed by dry-etching the barrier layer BA and the channel layer CH by using the photoresist film PR2 as a mask. As an etching gas, for example, a halogen gas ($Cl_2$, HBr, $BCl_3$, or the like) is used and dry-etching is performed under plasma atmosphere. As a plasma source, for example, ICP (inductively-coupled plasma) or the like can be used.

In the opening region OA, the barrier layer BA is etched from the surface to a depth of 25 nm in order to remove the two-dimensional electron gas 2DEG. In other words, the height difference between the bottom surface of the barrier layer BA and the bottom surface of the trench T is about 10 nm. The side surface of the trench T may be a tapered shape. In other words, the side surface of the trench T may be inclined. In other words, an inclination angle of the trench T may be smaller than 90 degrees (see the fourth embodiment).

Subsequently, the photoresist film PR2 is removed. Thereby, as shown in FIG. 9, the barrier layer (AlGaN) BA and a surface portion of the channel layer (GaN) CH in the opening region OA are removed, so that the channel layer CH is exposed from the bottom surface of the trench T, the channel layer CH is exposed from a lower portion of the side surface of the trench T, and the barrier layer BA is exposed from an upper portion of the side surface of the trench T. Subsequently, the photoresist film PR2 is removed. Here, the insulating film IF remains over the barrier layer BA in a region other than the region where the opening region OA is formed. In other words, the barrier layer BA in a region other than the region where the opening region OA is formed is covered by the insulating film IF.

Subsequently, as shown in FIG. 10, the epitaxial regrowth layer EP is formed over the bottom surface and the side surface of the trench T. This layer is formed by an epitaxial method. For example, as the epitaxial regrowth layer EP, a gallium nitride (GaN) layer is heteroepitaxially grown over the bottom surface and the side surface of the trench T by using the metal organic chemical vapor deposition method. The film thickness of the epitaxial regrowth layer EP is, for example, about 2 nm. For example, a compound gas including a constituent element of a nitride semiconductor is used as a raw material gas. For example, trimethylgallium (TMGa) is used as a Ga raw material and $NH_3$ is used as an N raw material. For example, a thin film (for example, a thin film whose thickness is 10 nm or less) of the epitaxial regrowth layer (GaN layer) EP can be well controllably formed by heteroepitaxially growing the epitaxial regrowth layer EP under a condition in which a growing rate is lowered by increasing a ratio of a partial pressure of $NH_3$ which is a group V material to a partial pressure of TMGa which is a group III material (V/III ratio).

Figure 11:
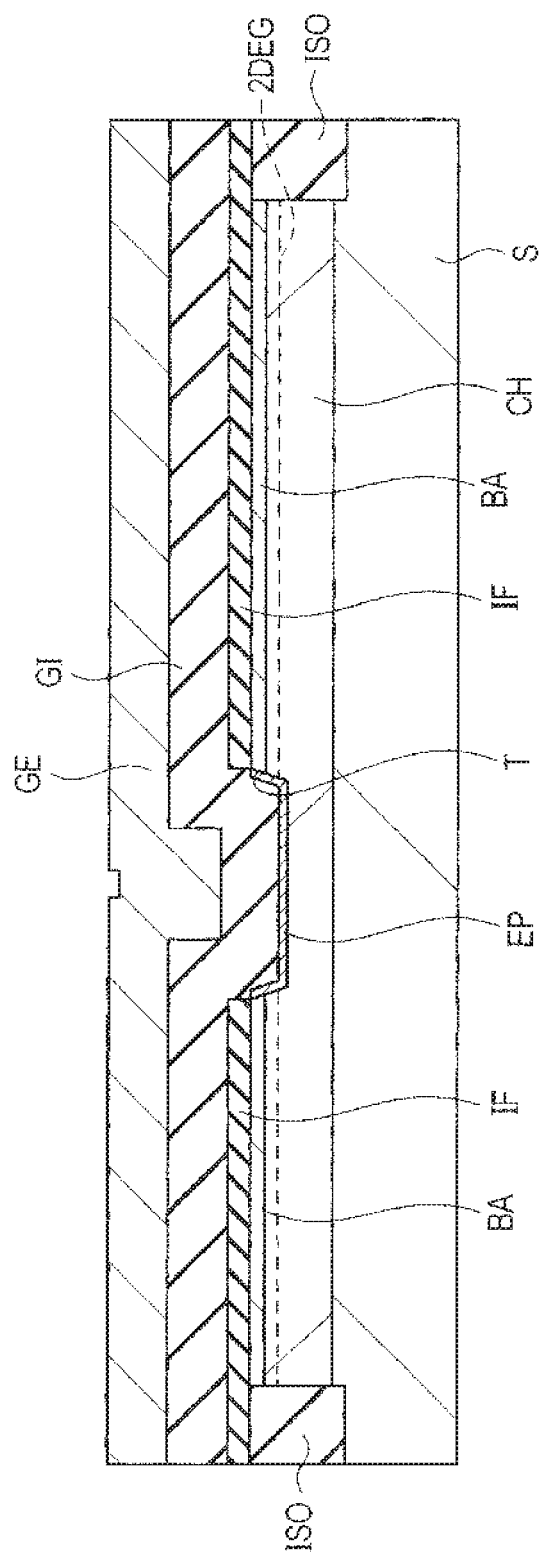
FIG. 11 is a cross-sectional view showing a manufacturing process of the semiconductor device of the first embodiment and is a cross-sectional view showing a manufacturing process following that in FIG. 10.

Subsequently, as shown in FIG. 11, the gate insulating film GI is formed inside the trench T (over the epitaxial regrowth layer EP) and over the insulating film IF. For example, as the gate insulating film GI, an aluminum oxide film (alumina, $Al_2O_3$) having a film thickness of about 100 nm is deposited inside the trench T and over the insulating film IF by using an ALD (Atomic Layer Deposition) method or the like. As the gate insulating film GI, for example, a silicon oxide film and a silicon nitride film may be used in addition to the aluminum oxide film described above. Further, a high-dielectric-constant film whose dielectric constant is higher than that of a silicon oxide film may be used. As the high-dielectric-constant film, it is possible to use a hafnium-based insulating film such as a hafnium oxide film ($HfO_2$ film), a hafnium aluminate film, an HfON film (hafnium oxynitride film), an HfSiO film (hafnium silicate film), an HfSiON film (hafnium silicon oxynitride film), and an HfAlO film. In many cases, the thickness of the gate insulating film GI is greater than the depth of the trench T.

Subsequently, a conductive film to be the gate electrode GE is formed over the gate insulating film GI. For example, as the conductive film, for example, a TiN film is deposited over the gate insulating film GI by using a sputtering method or the like. As the conductive film, a laminated film (also referred to as an Au/Ni film) formed of a nickel (Ni) film and a gold (Au) film over the nickel film may be used.

Figure 12:
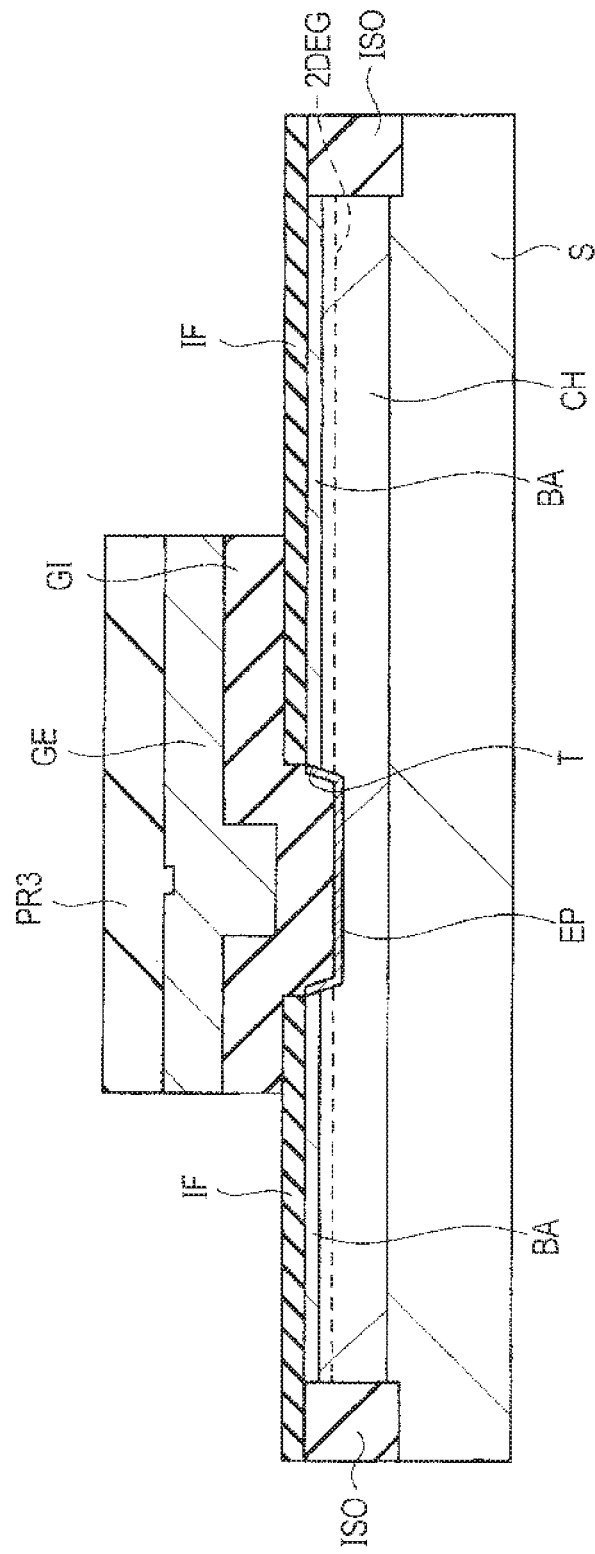
FIG. 12 is a cross-sectional view showing a manufacturing process of the semiconductor device of the first embodiment and is a cross-sectional view showing a manufacturing process following that in FIG. 11.

Subsequently, as shown in FIG. 12, the gate electrode GE is formed by patterning the gate electrode GE and the gate insulating film GI by using a photolithography technique and an etching technique. For example, a photoresist film PR3 that covers a region where the gate electrode GE is formed is formed by using the photolithography technique and the gate electrode GE and the gate insulating film GI are etched by using the photoresist film PR3 as a mask. Thereafter, the photoresist film PR3 is removed. When the etching is performed, the insulating film IF functions as an etching stopper. When patterning the gate electrode GE, the gate electrode GE is patterned into a shape projecting in one direction (in FIG. 12, toward the right, toward the drain electrode DE). In other words, the patterning is performed so that a field plate electrode is provided as part of the gate electrode GE. The field plate electrode is a partial region of the gate electrode GE and is an electrode portion extending from an end portion of the trench T facing the drain electrode DE toward the drain electrode DE. The gate electrode GE also projects in another direction (in FIG. 12, toward the left, toward the source electrode SE). However, the amount of projection toward the drain electrode DE is greater than that toward the source electrode SE.

Figure 13:
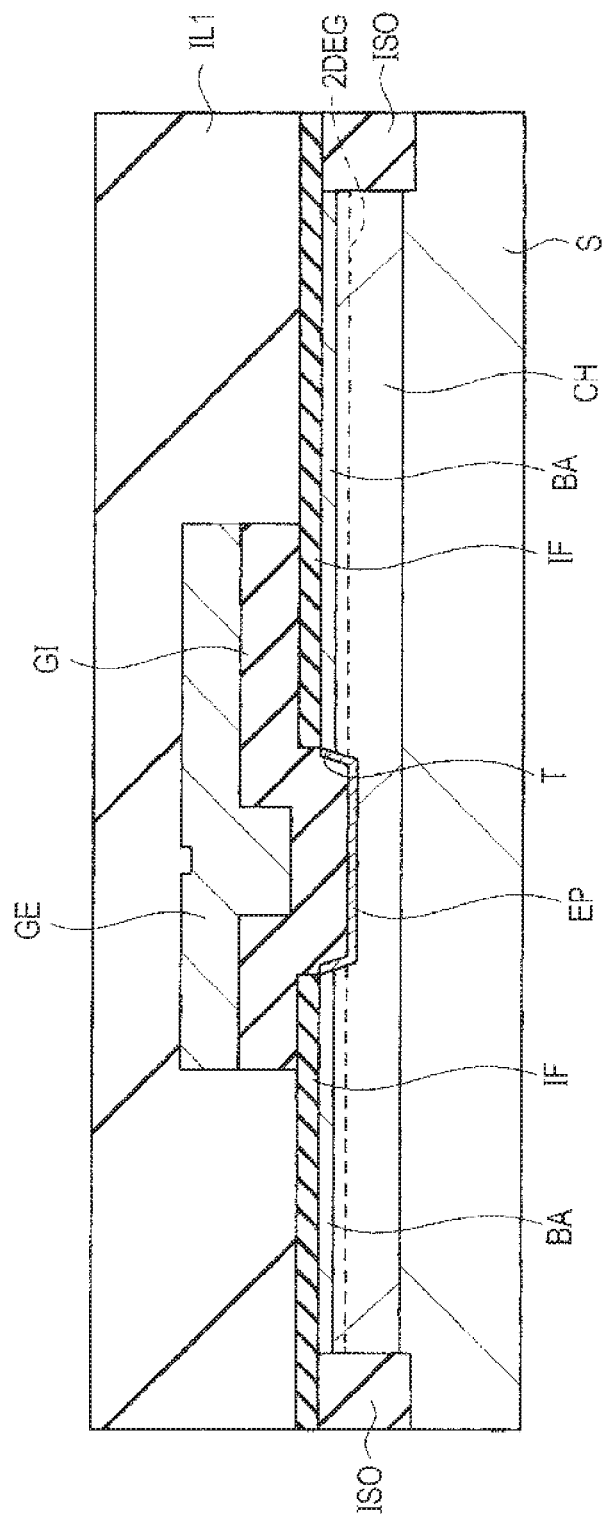
FIG. 13 is a cross-sectional view showing a manufacturing process of the semiconductor device of the first embodiment and is a cross-sectional view showing a manufacturing process following that in FIG. 12.

Subsequently, as shown in FIG. 13, the interlayer insulating film IL1 is formed over the gate electrode GE. As the interlayer insulating film IL1, for example, a silicon oxide film having a film thickness of about 700 nm is deposited over the gate electrode GE and the insulating film IF by using the CVD method or the like.

Figure 14:
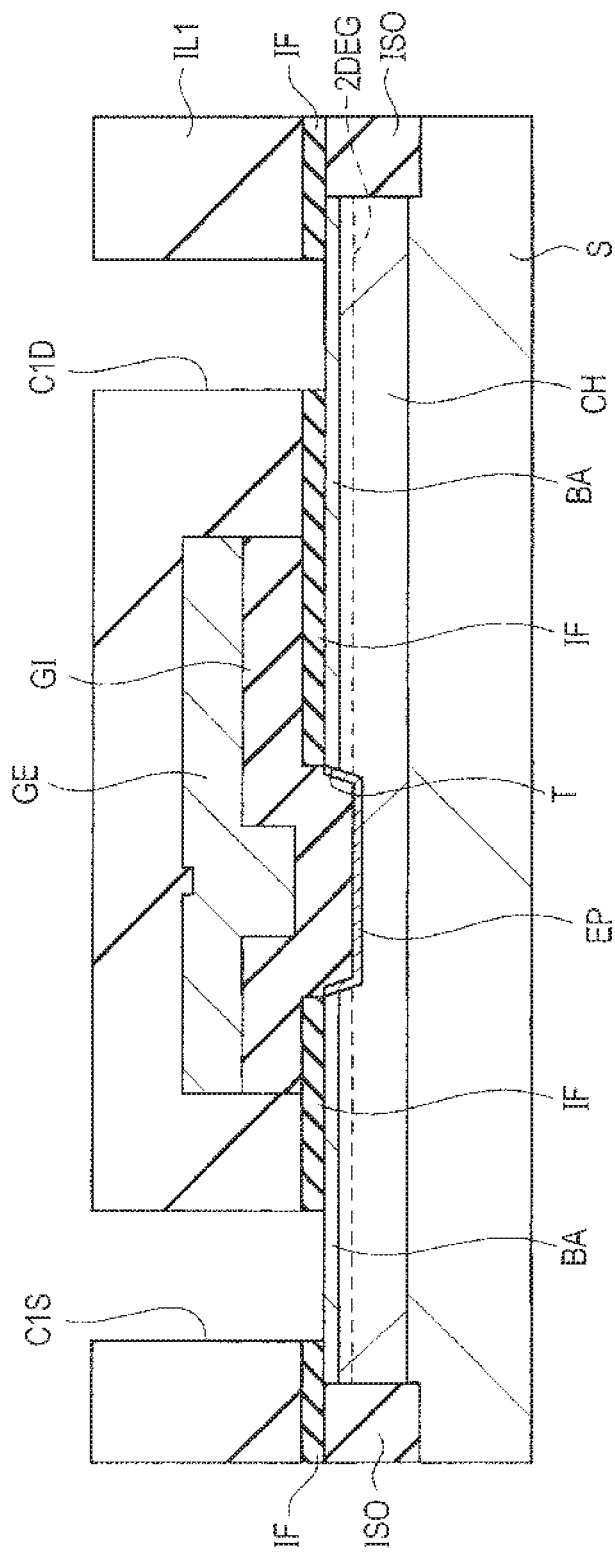
FIG. 14 is a cross-sectional view showing a manufacturing process of the semiconductor device of the first embodiment and is a cross-sectional view showing a manufacturing process following that in FIG. 13.

Subsequently, as shown in FIG. 14, the contact holes C1S and C1D are formed in the interlayer insulating film IL1 by using a photolithography technique and an etching technique. For example, the contact hole C1S is formed by etching the interlayer insulating film IL1 in a region where the source electrode SE is formed by using a photoresist mask not shown in FIG. 14 as a mask, and the contact hole C1D is formed by etching the interlayer insulating film IL1 in a region where the drain electrode DE is formed by using the photoresist mask not shown in FIG. 14 as a mask. When the etching is performed, the insulating film IF below the interlayer insulating film IL1 is also removed. Thereby, the barrier layer BA is exposed from the bottom portions of the contact hole C1S and the contact hole C1D. In this way, the contact hole C1S and the contact hole C1D are respectively arranged over the barrier layers BA on both sides of the gate electrode GE.

Figure 15:
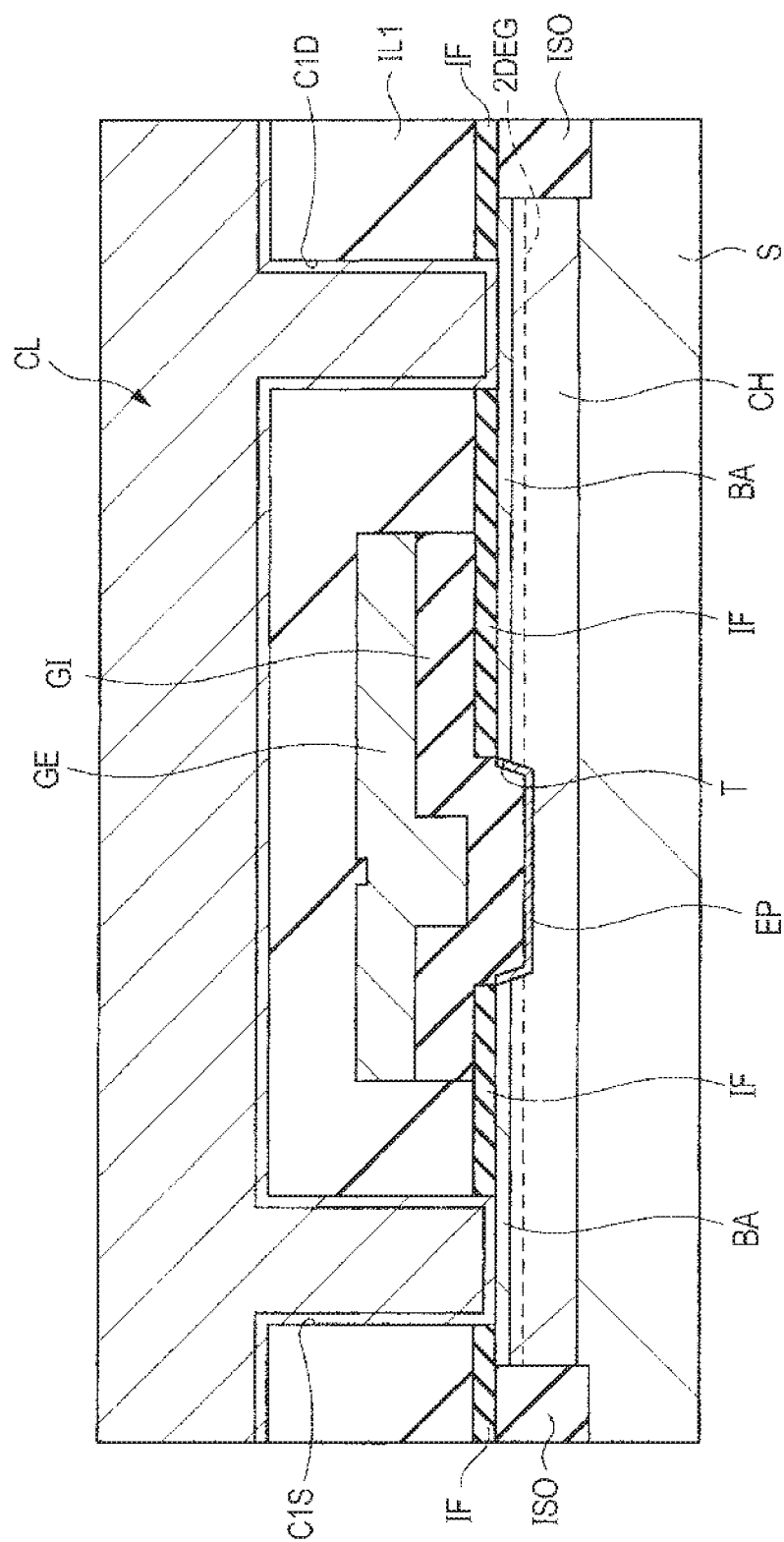
FIG. 15 is a cross-sectional view showing a manufacturing process of the semiconductor device of the first embodiment and is a cross-sectional view showing a manufacturing process following that in FIG. 14.

Subsequently, as shown in FIG. 15, a conductive film CL is formed over the interlayer insulating film IL1 including inside of the contact holes C1S and C1D. First, an ohmic layer is formed over the interlayer insulating film IL1 including inside of the contact holes C1S and C1D. For example, a titanium (Ti) film having a thickness of about 50 nm is deposited over the interlayer insulating film IL1 including inside of the contact holes C1S and C1D by using a sputtering method or the like. Subsequently, as a metal film, an aluminum film having a film thickness of about 600 nm is deposited over the ohmic layer by using a sputtering method or the like. Subsequently, a heat treatment is performed in order to reduce a contact resistance of the ohmic layer on the barrier layer BA. For example, the heat treatment is performed at about 650° C. for about 30 seconds in a nitrogen atmosphere. As the metal film, an aluminum alloy may be used in addition to aluminum. As the aluminum alloy, for example, it is possible to use an alloy of Al and Si (Al—Si), an alloy of Al and Cu (copper) (Al—Cu), an alloy of Al, Si, and Cu (Al—Si—Cu), and the like.

Figure 16:
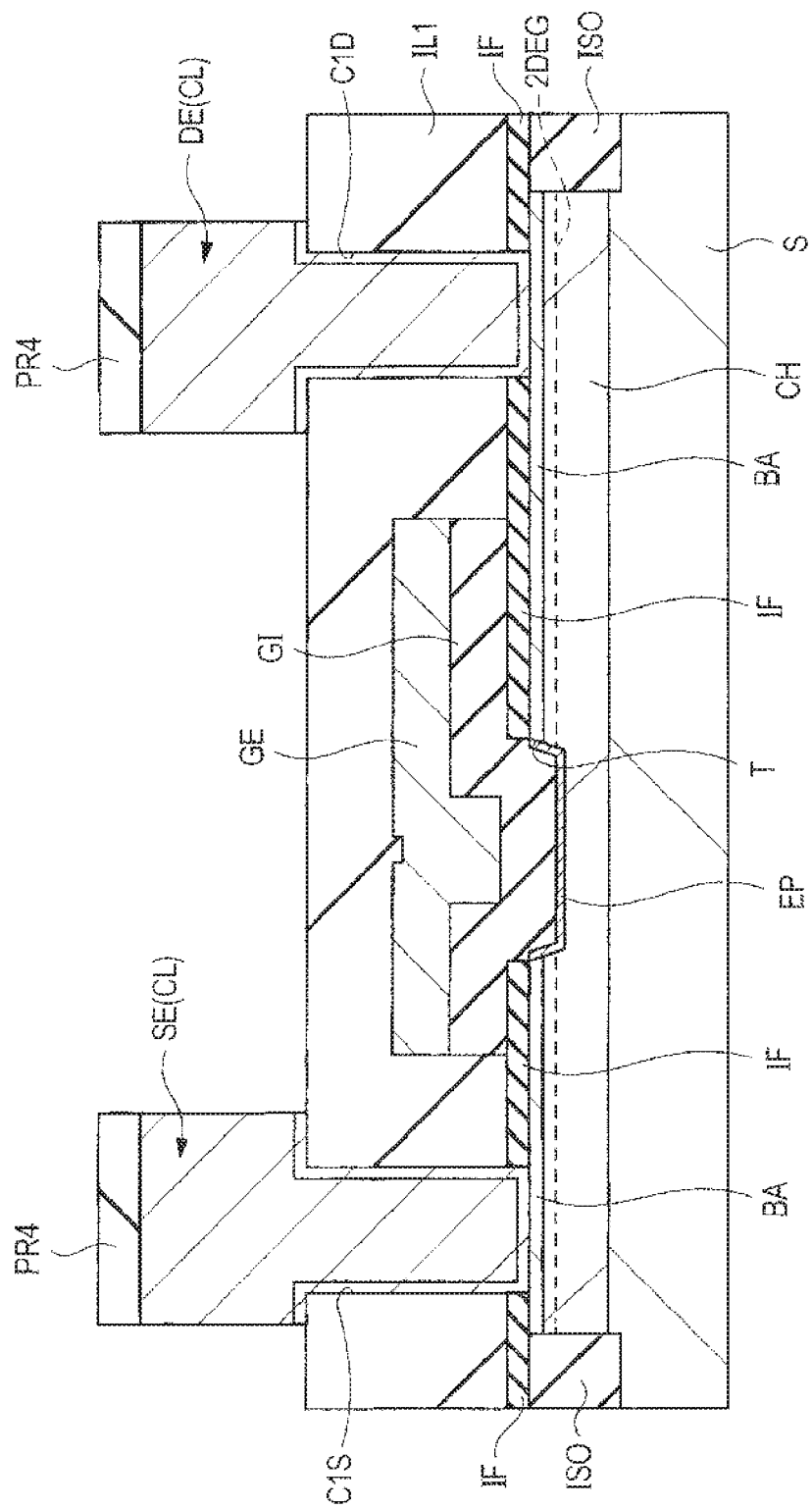
FIG. 16 is a cross-sectional view showing a manufacturing process of the semiconductor device of the first embodiment and is a cross-sectional view showing a manufacturing process following that in FIG. 15.

Subsequently, as shown in FIG. 16, the source electrode SE and the drain electrode DE are formed inside and over the contact holes C1S and C1D by patterning the Ti/Al films by using a photolithography technique and an etching technique. For example, a photoresist film PR4 that covers a region where the source electrode SE is formed and a region where the drain electrode DE is formed is formed over the conductive film CL by using the photolithography technique, and the conductive film CL is etched by using the photoresist film PR4 as a mask. Thereby, the source electrode SE and the drain electrode DE are formed. Thereafter, the photoresist film PR4 is removed.

Subsequently, the protective insulating film (also referred to as a surface protective film) PRO is formed over the interlayer insulating film IL1 including regions over the source electrode SE and the drain electrode DE. As the protective insulating film PRO, for example, a silicon oxide nitride film (SiON) film is deposited over the interlayer insulating film IL1 including regions over the source electrode SE and the drain electrode DE by using a CVD method or the like (see FIG. 1).

The semiconductor device shown in FIG. 1 can be formed by the process described above. The process described above is an example, and the semiconductor device of the present embodiment may be manufactured by a process other than the process described above.

In this way, according to the present embodiment, the epitaxial regrowth layer EP is formed on the bottom surface and the side surface of the trench T, so that it is possible to reduce roughness (unevenness) of a crystal surface of a channel formation region.

Figure 17A:
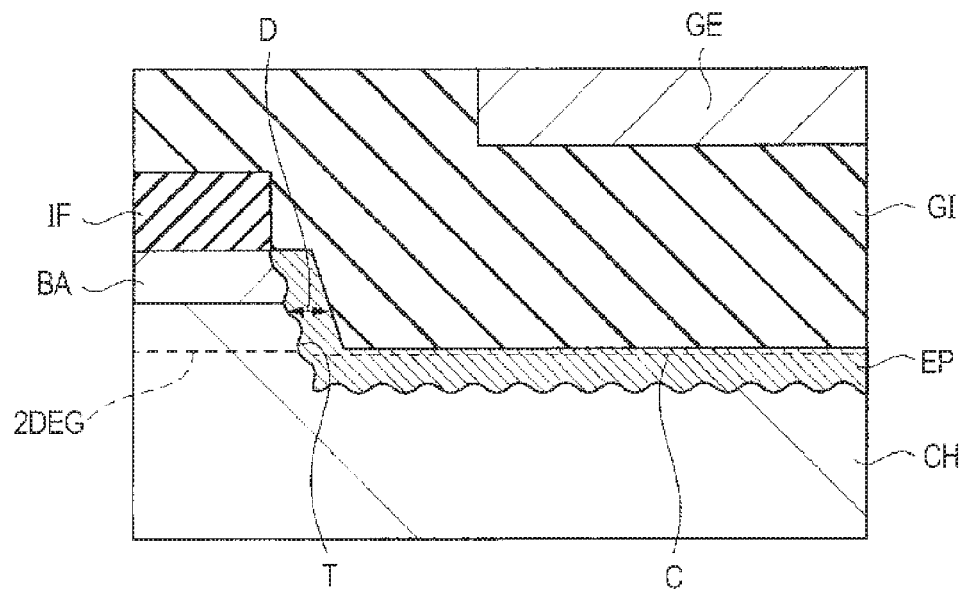
FIGS. 17A and 17B are cross-sectional views showing a configuration of a portion near a trench portion of the semiconductor device of the first embodiment and a semiconductor device of a comparative example.
Figure 17B:
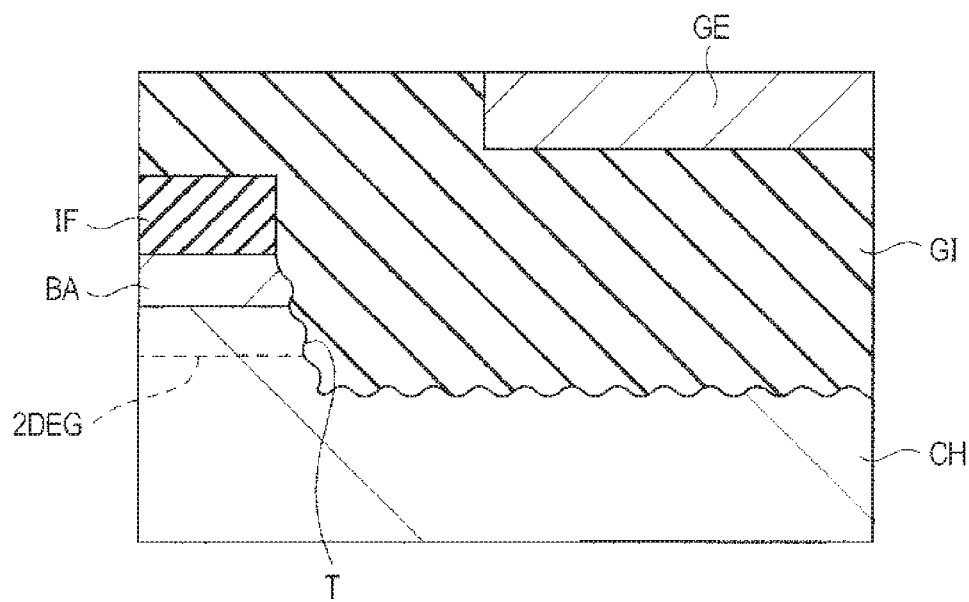

FIGS. 17A and 17B are cross-sectional views showing a configuration of a portion near the trench portion of the semiconductor device of the present embodiment and a semiconductor device of a comparative example. FIG. 17A is a schematic cross-sectional view of the semiconductor device of the present embodiment. FIG. 17B is a schematic cross-sectional view of the semiconductor device of the comparative example.

As shown in FIG. 17B, the trench T is formed by processing such as etching, so that roughness (unevenness) of a crystal surface occurs on the bottom surface and the side surface of the trench T. The unevenness as described above is, for example, about 0.5 nm. When the gate insulating film GI and the gate electrode GE are formed over the bottom surface and the side surface of the trench T, the interface between the gate insulating film GI and the channel layer CH is also uneven. Therefore, the channel formation region is also uneven, so that the mobility of carriers (here, electrons) moving through the channel deteriorates. Therefore, the on-resistance of the element increases.

On the other hand, as shown in FIG. 17A, when the epitaxial regrowth layer EP is formed on the bottom surface and the side surface of the trench T, the roughness (unevenness) of the crystal surface is reduced on the surface of the epitaxial regrowth layer EP. Further, in this case, a channel is formed in the interface between the gate insulating film GI and the epitaxial regrowth layer EP, so that the mobility of carriers improves. Therefore, the on-resistance of the element decreases.

A preferable film thickness of the epitaxial regrowth layer EP is 1 nm to 10 nm. When the film thickness is smaller than 1 nm, it is not possible to sufficiently flatten the unevenness of 0.5 nm. Further, when forming a film having a film thickness smaller than 1 nm, it is difficult to control the film thickness, so that variation of film thickness easily occurs. When the film thickness is greater than 10 nm, the variation of shape of the trench T increases. Specifically, the width and the depth of the trench T largely change. It is often more difficult to control the film thickness in film formation than to control the etching, so that the variation of element characteristics increases due to the variation of film thickness. When the film thickness of the epitaxial regrowth layer EP over the side surface of the trench T increases, the resistance between the source electrode SE and the drain electrode DE increases. The two-dimensional electron gas 2DEG is not generated in the epitaxial regrowth layer EP over the side surface of the trench T, so that when the distance D shown in FIG. 17A increases, the distance between the two-dimensional electron gas 2DEG and the channel C increases. A path of the carriers (here, electrons) from the drain electrode DE to the source electrode SE is a path crossing the epitaxial regrowth layer EP over the side surface of the trench T, so that it is preferable that the film thickness of the epitaxial regrowth layer EP is small (10 nm or less).

When the film thickness of the epitaxial regrowth layer EP is small (10 nm or less), the influence of the epitaxial regrowth layer EP growing over the insulating film IF is small, so that it is possible to omit a re-forming process of the insulating film IF and the like. Specifically, when the film thickness of the epitaxial regrowth layer EP is large, deposits may occur over the insulating film IF during the epitaxial regrowth. When the deposits are thick, the deposits are difficult to be removed by simple processing such as washing, so that a removing process (an etching process) is additionally required. Damages may occur in the surface of the insulating film IF which is exposed to the etching process, so that the re-forming process of the insulating film IF is required.

In the present embodiment, a combination of a GaN layer, an AlGaN layer, and a GaN layer is used as a combination of the channel layer CH, a barrier layer BA, and an epitaxial regrowth layer EP. However, another combination may be used.

For example, an AlGaN layer may be used as the epitaxial regrowth layer EP. In this way, a nitride semiconductor such as an AlGaN layer or the like, which is different from the channel layer CH, may be used. The epitaxial regrowth layer EP is thin (for example, 10 nm or less), so that even when a nitride semiconductor such as an AlGaN layer or the like, which is different from the channel layer CH, is used, no two-dimensional electron gas is generated in the interface with the channel layer CH, and further, a channel C is formed by applying a potential to the gate electrode GE when a nitride semiconductor is used. However, from a viewpoint of crystal growth property and threshold voltage control, it is preferable to use the same nitride semiconductor as the channel layer CH as the epitaxial regrowth layer EP.

In FIG. 17B, the gate insulating film GI is in contact with the channel layer CH on the bottom surface and a lower side surface of the trench T and is in contact with the barrier layer BA on an upper side surface of the trench T. When the gate insulating film GI is in contact with a semiconductor layer having a different composition, an interface between the compositions becomes electron traps. When the electron traps are close to each other, element characteristics may vary due to charging/discharging of electrons to/from the traps.

On the other hand, in the present embodiment (FIG. 17A), the gate insulating film GI is in contact with the epitaxial regrowth layer EP, so that it is possible to reduce the influence of the traps and to suppress the variation of the element characteristics.

Application Example

Figure 18:
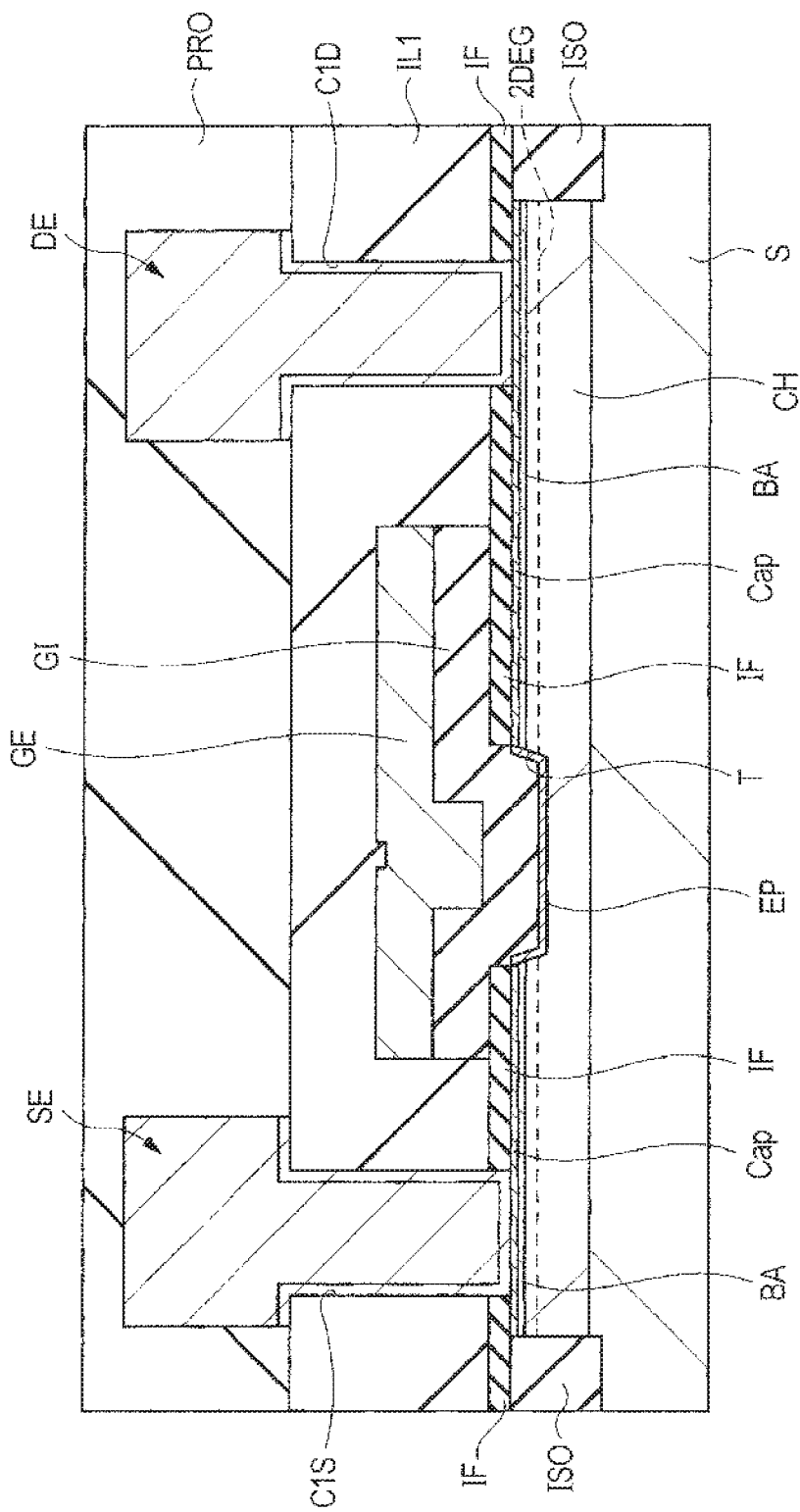
FIG. 18 is a cross-sectional view showing a configuration of a semiconductor device of an application example of the first embodiment.

In the embodiment described above (FIG. 1), the insulating film IF is arranged over the barrier layer BA. However, a cap layer Cap may be provided between the barrier layer BA and the insulating film IF. FIG. 18 is a cross-sectional view showing a configuration of a semiconductor device of an application example of the present embodiment.

In the present application example, as shown in FIG. 18, the cap layer Cap is provided between the barrier layer BA and the insulating film IF. The cap layer Cap is a nitride semiconductor whose electron affinity is greater than that of the barrier layer BA. As the cap layer Cap, for example, a gallium nitride (GaN) layer can be used. The GaN layer is heteroepitaxially grown by using, for example, the metal organic chemical vapor deposition method.

In this case, the trench T is formed which penetrates the insulating film IF, the cap layer Cap, and the barrier layer BA and reaches the inside of the channel layer CH, and the epitaxial regrowth layer EP is formed on the bottom surface and the side surface of the trench T. Specifically, the epitaxial regrowth layer EP is formed on the bottom surface of the trench T from which the channel layer CH is exposed, a lower portion of the side surface of the trench T from which the channel layer CH is exposed, a central portion of the side surface of the trench T from which the barrier layer BA is exposed, and an upper portion of the side surface of the trench T from which the cap layer Cap is exposed.

In the case of the application example shown in FIG. 18, the source electrode SE and the drain electrode DE are formed over the cap layer Cap on both sides of the gate electrode GE.

Also in the case of the application example, in the same manner as in FIG. 1 and the like, an effect is obtained in which the deterioration of mobility of carriers is suppressed by the epitaxial regrowth layer EP on the bottom surface and the side surface of the trench T.

Further, it is possible to reduce a coupling resistance (an ohmic coupling resistance) between the cap layer Cap and the source electrode SE by providing the cap layer Cap. Further, it is possible to reduce a coupling resistance (an ohmic coupling resistance) between the cap layer Cap and the drain electrode DE.

Second Embodiment

In the present embodiment, the film thickness of the epitaxial regrowth layer EP formed on the side surface of the trench T is smaller than the film thickness of the epitaxial regrowth layer EP formed on the bottom surface of the trench T.

Hereinafter, a semiconductor device of the present embodiment will be described in detail with reference to the drawings. In the present embodiment, components other than the epitaxial regrowth layer EP are the same as those of the semiconductor device of the first embodiment. Therefore, the description of the structure and the manufacturing process that are the same as those in the first embodiment will be omitted.

Description of Structure

Figure 19:
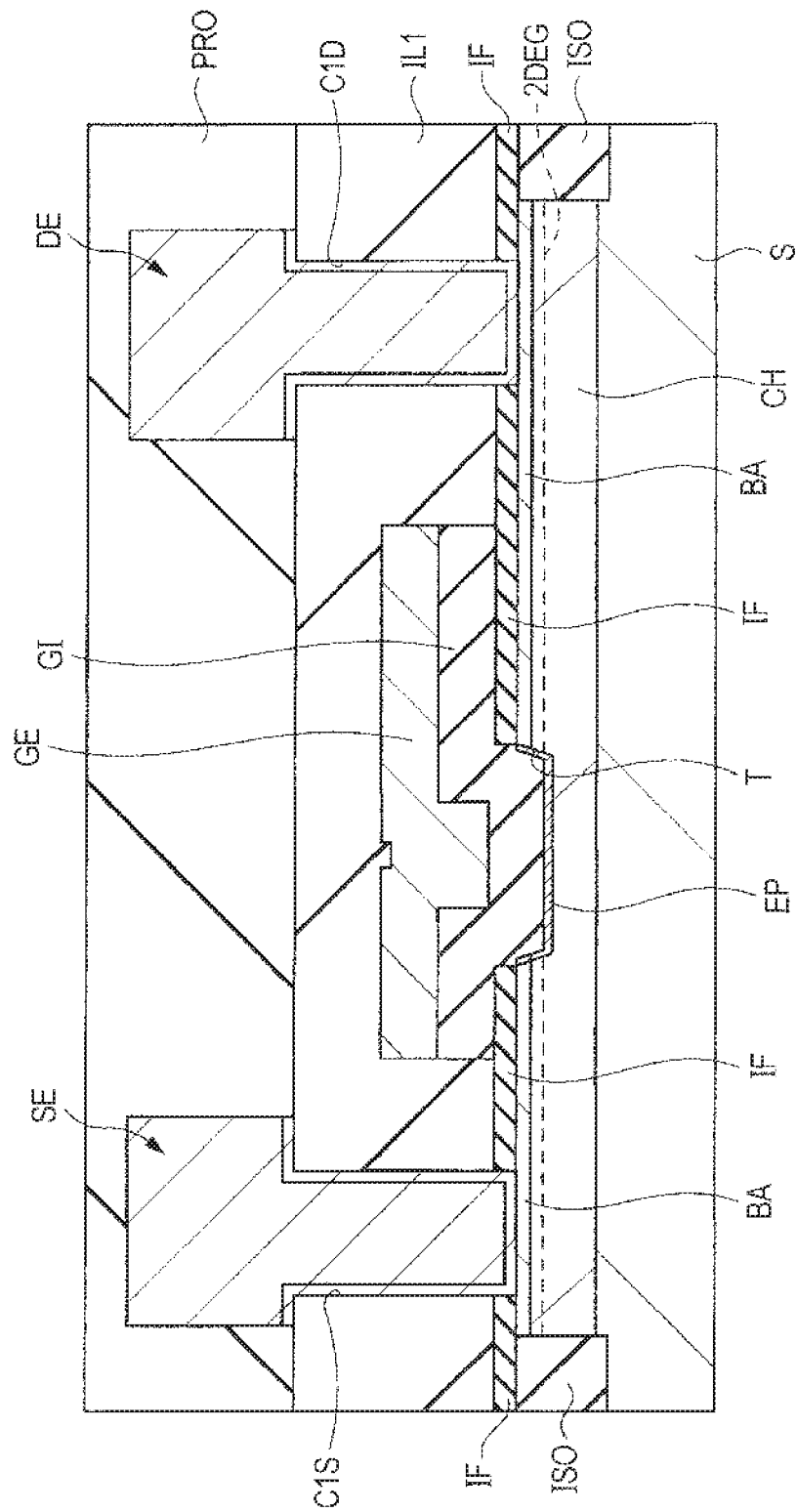
FIG. 19 is a cross-sectional view showing a configuration of a semiconductor device of a second embodiment.
Figure 20:
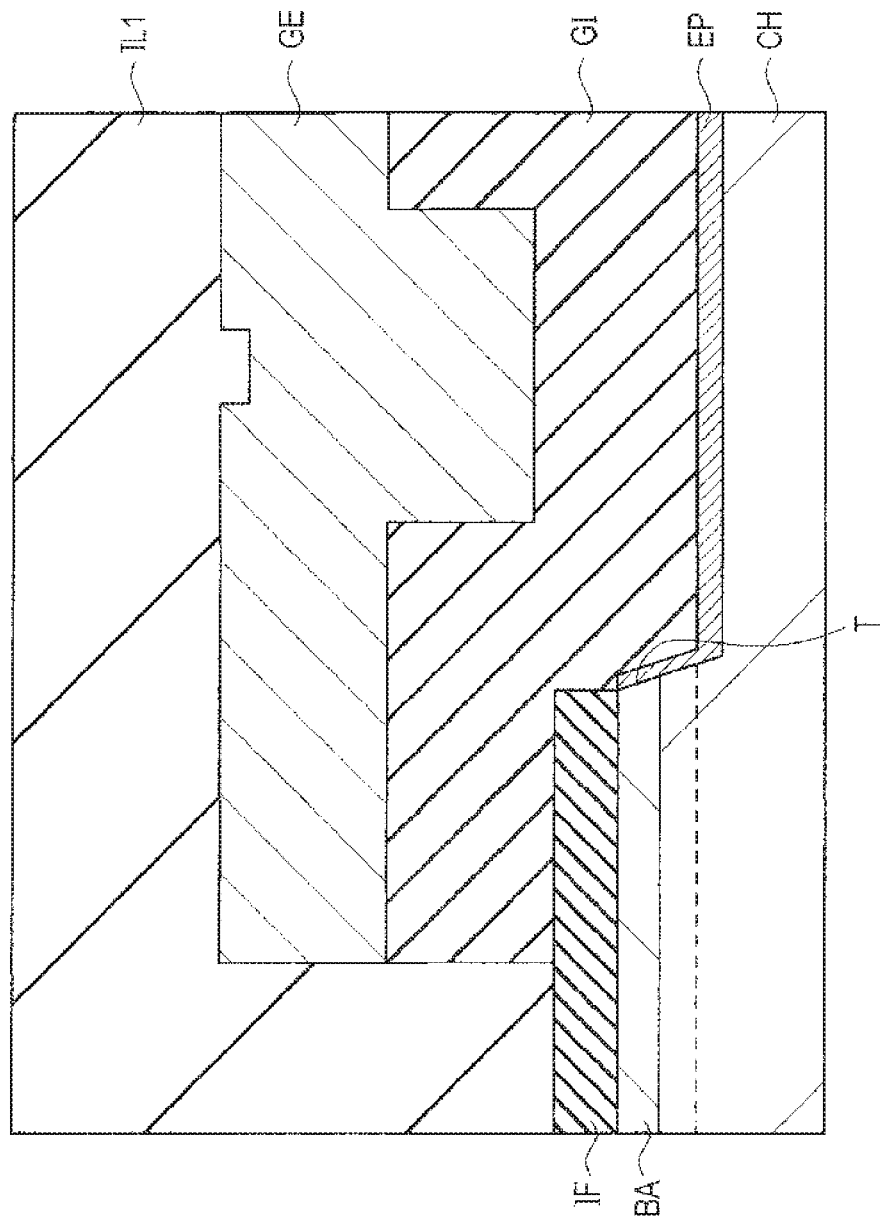
FIG. 20 is a cross-sectional view showing a configuration of a portion near a trench portion of the semiconductor device of the second embodiment.

FIG. 19 is a cross-sectional view showing a configuration of the semiconductor device of the present embodiment. FIG. 20 is a cross-sectional view showing a configuration of a portion near a trench portion of the semiconductor device of the present embodiment.

As shown in FIGS. 19 and 20, also in the present embodiment, the epitaxial regrowth layer EP is formed on the bottom surface (bottom portion) and the side surface (side portion) of the trench T. The epitaxial regrowth layer EP is formed of a nitride semiconductor.

The film thickness of the epitaxial regrowth layer EP formed on the side surface of the trench T is smaller than the film thickness of the epitaxial regrowth layer EP formed on the bottom surface of the trench T (FIG. 20).

The epitaxial regrowth layer EP is provided on the bottom surface and the side surface of the trench T in this way, so that roughness (unevenness) of the crystal surface of the bottom surface and the side surface of the trench T is reduced and it is possible to improve flatness of the interface between the gate insulating film GI and the epitaxial regrowth layer EP. Therefore, it is possible to suppress deterioration of mobility of carriers (here, electrons) moving through a channel formed on the bottom surface and the side surface of the trench T.

Further, the epitaxial regrowth layer EP is formed in addition to the channel layer CH, so that, as described in the first embodiment, it is possible to reduce influence of trap and improve characteristics of the semiconductor device.

Further, according to the present embodiment, the film thickness of the epitaxial regrowth layer EP formed on the side surface of the trench T is smaller than the film thickness of the epitaxial regrowth layer EP formed on the bottom surface of the trench T, so that it is possible to reduce the resistance between the source electrode SE and the drain electrode DE. In other words, as described in the first embodiment with reference to FIGS. 17A and 17B, it is possible to reduce the resistance between the source electrode SE and the drain electrode DE by reducing the distance between the two-dimensional electron gas 2DEG and the channel C.

Description of Manufacturing Method

Figure 21:
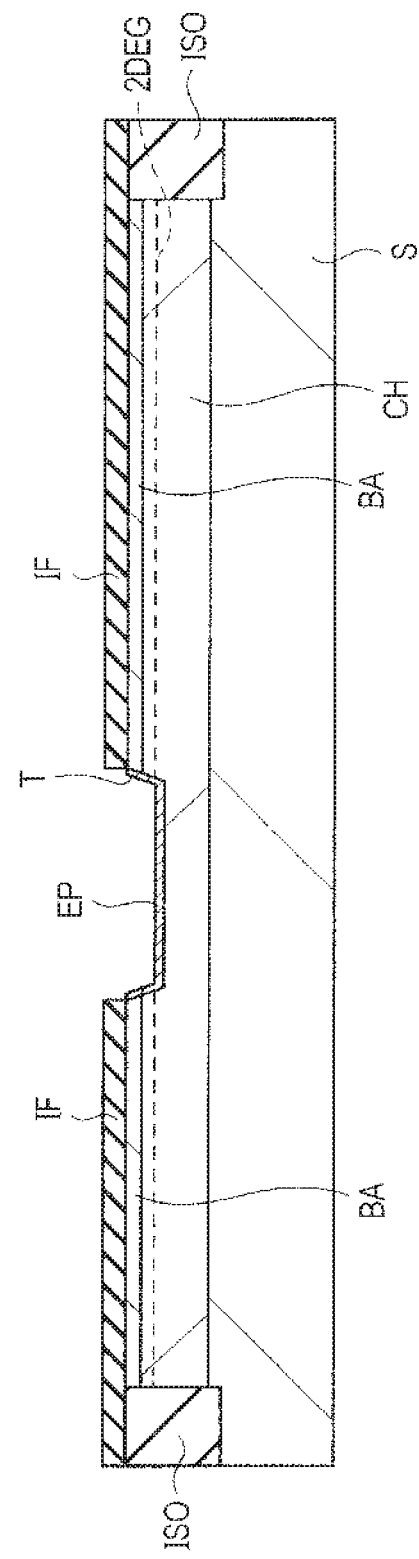
FIG. 21 is a cross-sectional view showing a manufacturing process of the semiconductor device of the second embodiment.

The semiconductor device of the present embodiment can be formed in the same process as that of the first embodiment. FIG. 21 is a cross-sectional view showing a manufacturing process of the semiconductor device of the present embodiment.

For example, the trench T is formed in the same manner as in the first embodiment (see FIGS. 5 to 9). The channel layer CH is exposed from the bottom surface of the trench T, the channel layer CH is exposed from a lower portion of the side surface of the trench T, and the barrier layer BA is exposed from an upper portion of the side surface of the trench T.

Subsequently, as shown in FIG. 21, the epitaxial regrowth layer EP is formed over the bottom surface and the side surface of the trench T. This layer is formed by an epitaxial method. For example, as the epitaxial regrowth layer EP, a gallium nitride (GaN) layer is heteroepitaxially grown over the bottom surface and the side surface of the trench T by using the metal organic chemical vapor deposition method. The film thickness of the epitaxial regrowth layer EP over the bottom surface is, for example, about 3 nm, and the film thickness of the epitaxial regrowth layer EP over the side surface is, for example, about 1.5 nm. However, the film thicknesses of the bottom surface and the side surface and the ratio of the film thicknesses are not limited to the numerical values described above.

For example, a compound gas including a constituent element of a nitride semiconductor is used as a raw material gas. For example, trimethylgallium (TMGa) is used as a Ga raw material and $NH_3$ is used as an N raw material. For example, a thin film (for example, a thin film whose thickness is 10 nm or less) of the epitaxial regrowth layer (GaN layer) EP can be well controllably formed by heteroepitaxially growing the epitaxial regrowth layer EP under a condition in which a growing rate is lowered by increasing a ratio of a partial pressure of $NH_3$ which is a group V material to a partial pressure of TMGa which is a group III material (V/III ratio).

The crystal surface of the bottom surface of the trench T is a (0001) Ga surface and the film grows in a [0001] crystal axis (C axis) direction. On the other hand, the crystal surface of the side surface of the trench T is a surface different from the (0001) Ga surface, so that it is possible to easily differentiate growth of the film. For example, it is possible to adjust the growth rate of a layer over the bottom surface and a layer over the side surface by adjusting a film forming condition such as a growth temperature and a flow ratio of raw material gases (group V, group III). For example, when the growth rate of the layer over the side surface is set to a half of the growth rate of the layer over the bottom surface, it is possible to adjust the film thickness over the bottom surface to be about 3 nm and to adjust the film thickness over the side surface to be about 1.5 nm.

Although the film forming condition of the epitaxial regrowth layer EP is not limited, for example, it is possible to relatively reduce the growth rate of the layer over the side surface of the trench T by reducing a partial pressure ratio of the group V material gas to the group III material gas (V/III ratio). On the other hand, by increasing the partial pressure ratio (V/III ratio), it is possible to reduce a difference between the growth rate of the layer over the side surface of the trench T and the growth rate of the layer over the bottom surface of the trench T.

As described above, according to the present embodiment, the film thickness of the epitaxial regrowth layer EP formed on the side surface of the trench T is smaller than the film thickness of the epitaxial regrowth layer EP formed on the bottom surface of the trench T, so that it is possible to reduce the resistance between the source electrode SE and the drain electrode DE.

Further, it is possible to secure a certain level of film thickness at the bottom surface of the trench T, so that it is possible to improve the flatness of the interface between the gate insulating film GI and the epitaxial regrowth layer EP.

Third Embodiment

In the present embodiment, an end portion of the insulating film IF is retreated by a predetermined distance from an end portion of the trench T.

Hereinafter, a semiconductor device of the present embodiment will be described in detail with reference to the drawings. In the present embodiment, the description of the structure and the manufacturing process that are the same as those of the semiconductor device in the first embodiment will be omitted.

Description of Structure

Figure 22:
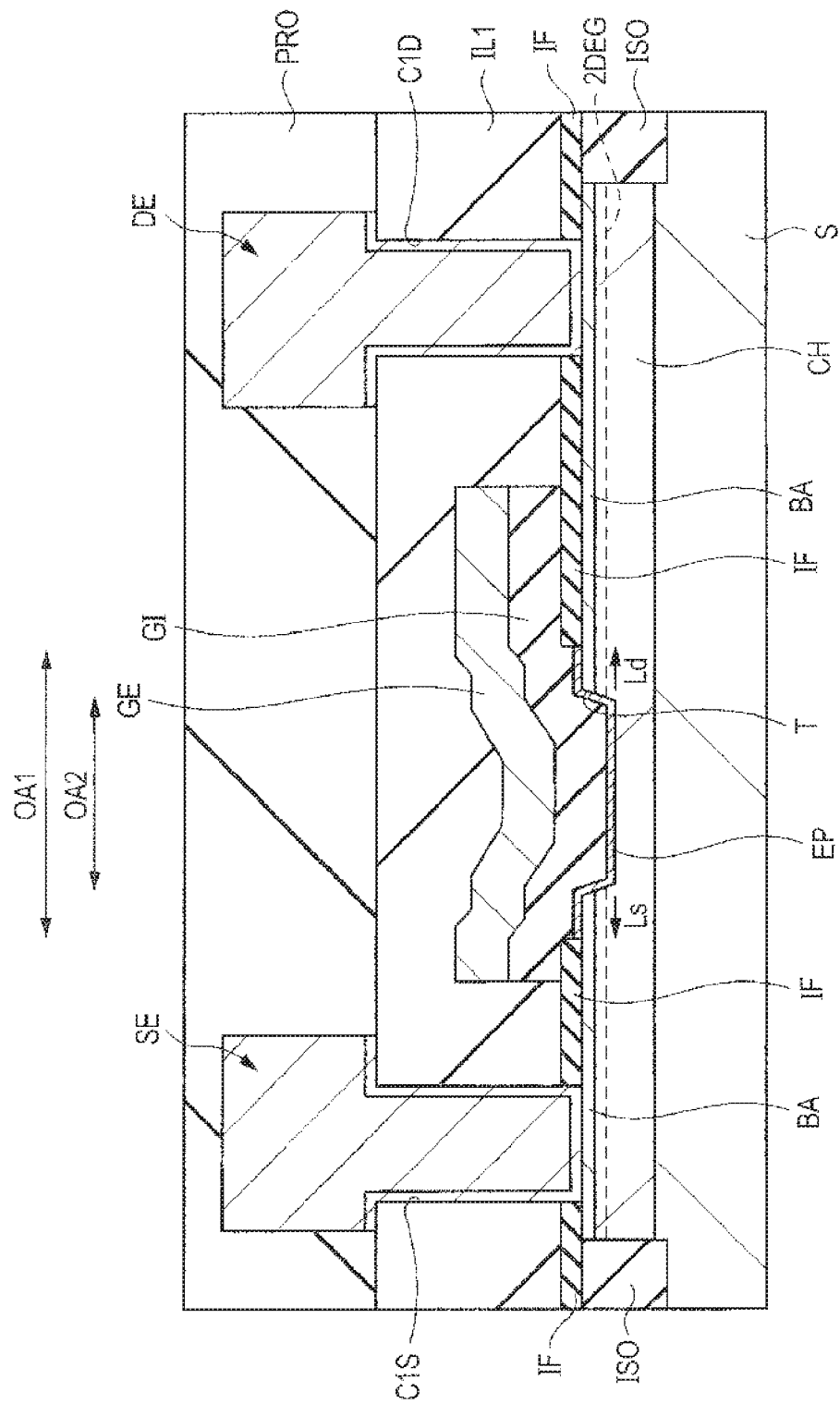
FIG. 22 is a cross-sectional view showing a configuration of a semiconductor device of a third embodiment.
Figure 23:
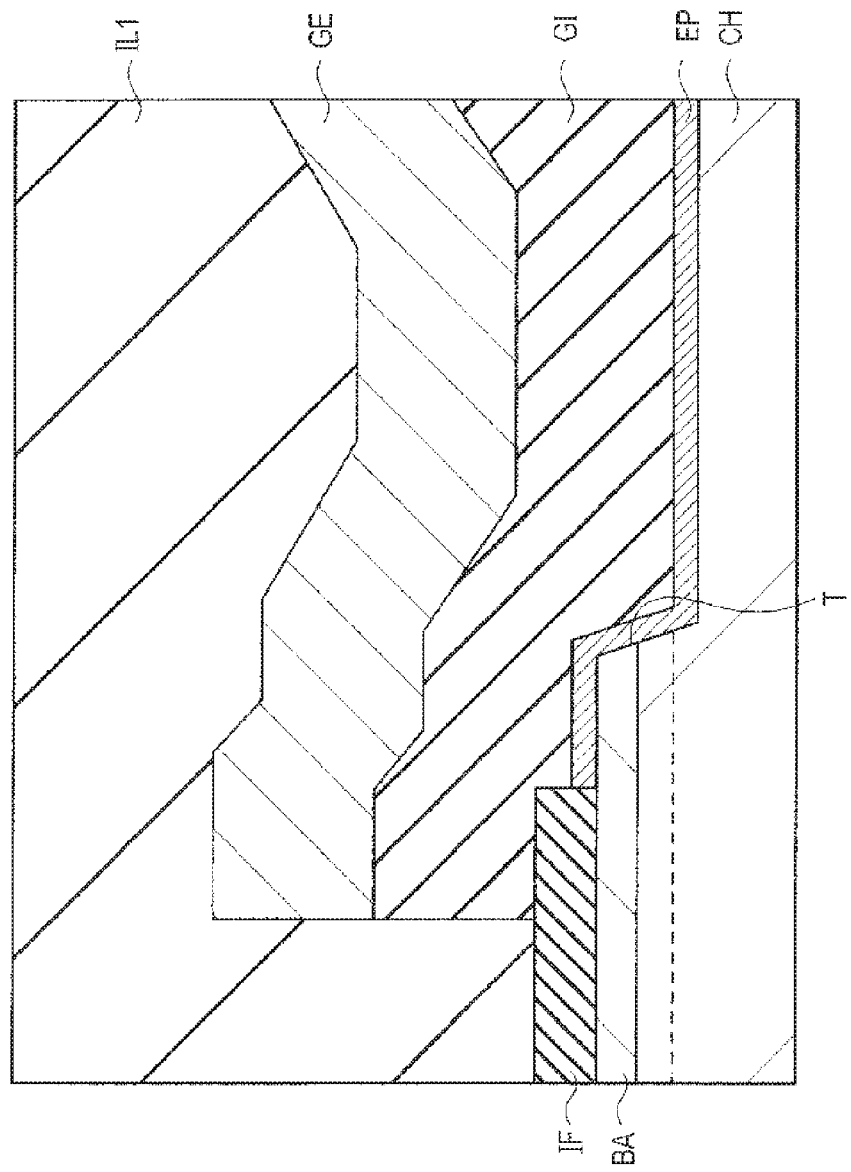
FIG. 23 is a cross-sectional view showing a configuration of a portion near a trench portion of the semiconductor device of the third embodiment.

FIG. 22 is a cross-sectional view showing a configuration of the semiconductor device of the present embodiment. FIG. 23 is a cross-sectional view showing a configuration of a portion near a trench portion of the semiconductor device of the present embodiment.

As shown in FIGS. 22 and 23, also in the present embodiment, the epitaxial regrowth layer EP is formed on the bottom surface (bottom portion) and the side surface (side portion) of the trench T. The epitaxial regrowth layer EP is formed of a nitride semiconductor.

Here, the insulating film IF has an opening portion in an opening region OA1. The opening portion is provided in a region larger than a region where the trench T is formed (an opening region OA2) by a distance Ld toward the drain electrode DE. In other words, the insulating film IF is retreated by the distance Ld from the end portion of the trench T facing the drain electrode DE. Further, the opening portion is provided in a region larger than the region where the trench T is formed (the opening region OA2) by a distance Ls toward the source electrode SE. In other words, the insulating film IF is retreated by the distance Ls from the end portion of the trench T facing the source electrode SE. In other words, the end portion of the insulating film IF is retreated from the end portion of the trench T toward the outside of the trench T. In other words, exposed regions of the surface of the barrier layer BA (regions where the opening region OA2 and the opening region OA1 do not overlap each other), that is, retreated portions (Ld and Ls) of the insulating film IF, correspond to the exposed regions of the surface of the barrier layer BA.

Therefore, the epitaxial regrowth layer EP is also formed over the barrier layer BA exposed from the end portion of the insulating film IF, in other words, in a region of the distance Ld from the end portion of the trench T and a region of the distance Ls from the end portion of the trench T over the barrier layer BA. In other words, the epitaxial regrowth layer EP is also formed over the barrier layer BA exposed from the retreated portions (Ld and Ls) of the insulating film IF.

When the epitaxial regrowth layer EP is provided over the bottom surface and the side surface of the trench T and over the barrier layer BA at both end portions of the trench T in this way, in the same manner as in the first embodiment, the roughness (unevenness) of the crystal surface of the bottom surface and the side surface of the trench T is reduced and it is possible to improve flatness of the interface between the gate insulating film GI and the epitaxial regrowth layer EP. Therefore, it is possible to suppress deterioration of mobility of carriers (here, electrons) moving through a channel formed on the bottom surface and the side surface of the trench T.

Further, the epitaxial regrowth layer EP is formed in addition to the channel layer CH, so that, as described in the first embodiment, it is possible to reduce influence of trap and improve characteristics of the semiconductor device.

Further, gate modulation becomes more effective by retreating the end portion of the insulating film IF toward the source electrode SE or the drain electrode DE. In other words, a channel is more easily formed. When the end portion of the insulating film IF is not retreated, in other words, when the end portion of the insulating film IF is extended to the end portion of the trench T, a laminated film of the gate insulating film GI and the insulating film IF is arranged on both sides of the trench T. On the other hand, in the present embodiment, a single layer of the gate insulating film GI is arranged on both sides of the trench T (on the retreated portions). Therefore, the film thickness of the insulating film under the gate electrode GE is small on both sides of the trench T (on the retreated portions), so that a channel is easily formed. Thereby, it is possible to reduce a channel resistance generated along the side surface of the trench T (in particular, along the side surface facing the drain electrode DE).

Further, an electric field concentrated portion is distributed by retreating the end portion of the insulating film IF toward the source electrode SE or the drain electrode DE. Therefore, the concentration of electric field is alleviated and the breakdown voltage of the gate is improved.

On both sides of the trench T (on the retreated portions), the gate insulating film GI is in contact with the epitaxial regrowth layer EP, so that it is possible to reduce current collapse. In other words, when the epitaxial regrowth layer EP is not formed, the barrier layer BA exposed to etching is in contact with the gate insulating film GI, so that the barrier layer BA is easily affected by interface trap. On the other hand, the gate insulating film GI is in contact with the epitaxial regrowth layer EP with less traps, so that it is possible to reduce current collapse.

Description of Manufacturing Method

FIGS. 24 to 31 are cross-sectional views showing a manufacturing process of the semiconductor device of the present embodiment.

As shown in FIG. 24, the substrate S, the channel layer CH, the barrier layer BA, and the insulting film IF are sequentially formed. The substrate S, the channel layer CH, the barrier layer BA, and the insulting film IF can be formed in the same manner as in the first embodiment by using the same materials as those used in the first embodiment. Subsequently, for example, a silicon oxide film or the like is formed as an insulating film IFM used as a mask by using a CVD method.

Subsequently, as shown in FIG. 25, a photoresist film (not shown in FIG. 25) having an opening portion in an opening region OA1 is formed over the insulating film IFM used as a mask by using a photolithography technique. Subsequently, the insulating film IFM used as a mask is etched by using the photoresist film as a mask. Thereby, the insulating film IFM used as a mask which has an opening portion in the opening region OA1 is formed over the insulating film IF. Subsequently, the photoresist film is removed.

Subsequently, as shown in FIG. 26, a photoresist film PR31 having an opening portion in an opening region OA2 located inside the opening region OA1 is formed by using a photolithography technique. Subsequently, the insulating film IF is etched by using the photoresist film PR31 as a mask. Subsequently, the photoresist film PR31 is removed. Thereby, the insulating film IF having an opening portion in the opening region OA2 is formed over the barrier layer BA. Further, over the insulating film IF, the insulating film IFM used as a mask, which has an opening portion in the opening region OA1 and which is retreated from one end of the opening region OA2, is arranged.

Subsequently, as shown in FIG. 27, the trench T which penetrates the insulating film IF and the barrier layer BA and reaches inside of the channel layer CH is formed by etching the barrier layer BA and the channel layer CH (also referred to as a laminated body) by using a laminated film of the insulating film IF and the insulating film IFM as a mask.

Figure 28:
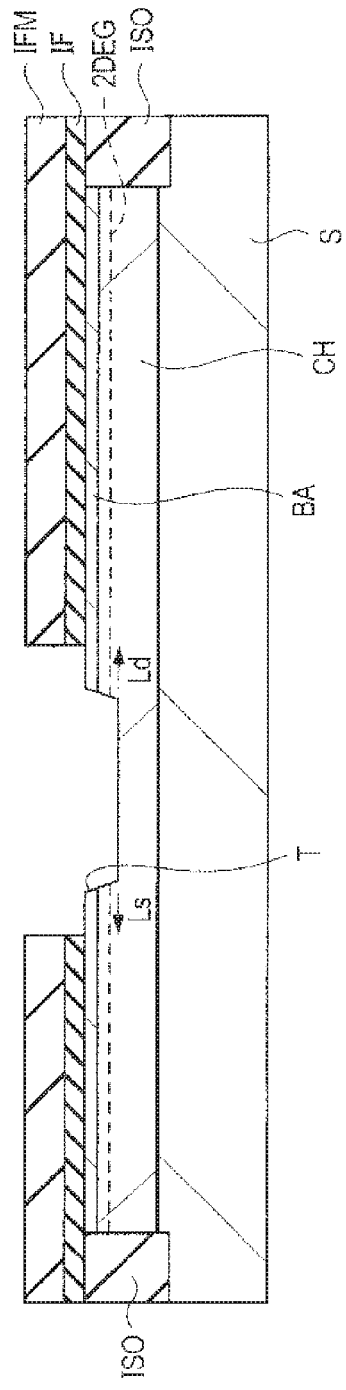
FIG. 28 is a cross-sectional view showing a manufacturing process of the semiconductor device of the second embodiment and is a cross-sectional view showing a manufacturing process following that in FIG. 27.
Figure 29:
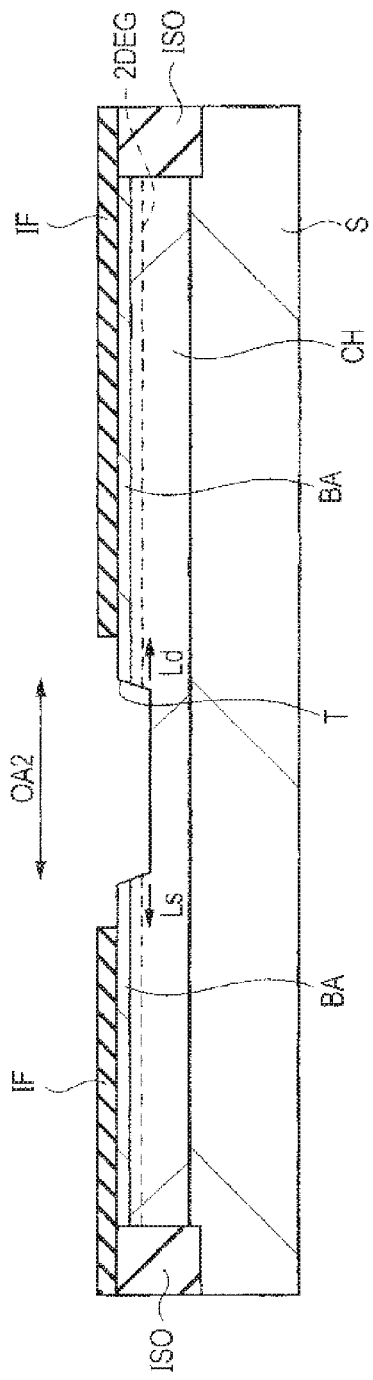
FIG. 29 is a cross-sectional view showing a manufacturing process of the semiconductor device of the second embodiment and is a cross-sectional view showing a manufacturing process following that in FIG. 28.

Subsequently, as shown in FIG. 28, the insulating film IF is etched by using the insulating film IFM as a mask. In other words, the insulating film IF at an outer circumferential portion of the trench T is etched. Thereby, an end portion of the insulating film IF facing the trench T is retreated in one direction (toward right in FIG. 28) by the distance Ld, and an end portion of the insulating film IF facing the trench T is retreated in the other direction (toward left in FIG. 28) by the distance Ls. Subsequently, as shown in FIG. 29, the insulating film IFM used as a mask is removed by etching. Thereby, in the opening region OA2, the channel layer CH is exposed from the bottom surface of the trench T, the channel layer CH is exposed from a lower portion of the side surface of the trench T, and the barrier layer BA is exposed from an upper portion of the side surface of the trench T. Further, the surface of the barrier layer BA is exposed in an outer circumferential region of the opening region OA2 (the retreated portion) in the opening region OA1.

Figure 30:
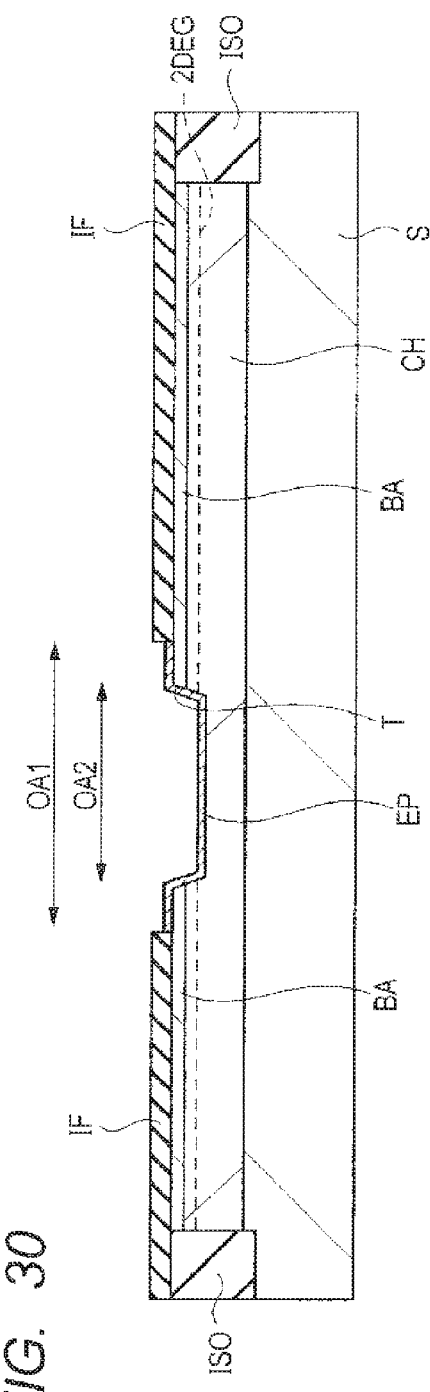
FIG. 30 is a cross-sectional view showing a manufacturing process of the semiconductor device of the second embodiment and is a cross-sectional view showing a manufacturing process following that in FIG. 29.

Subsequently, as shown in FIG. 30, the epitaxial regrowth layer EP is formed over the bottom surface and the side surface of the trench T and the exposed surface of the barrier layer BA (the retreated portion). The epitaxial regrowth layer EP can be formed in the same manner as in the first embodiment. The film thickness of the epitaxial regrowth layer EP is, for example, about 2 nm.

Figure 31:
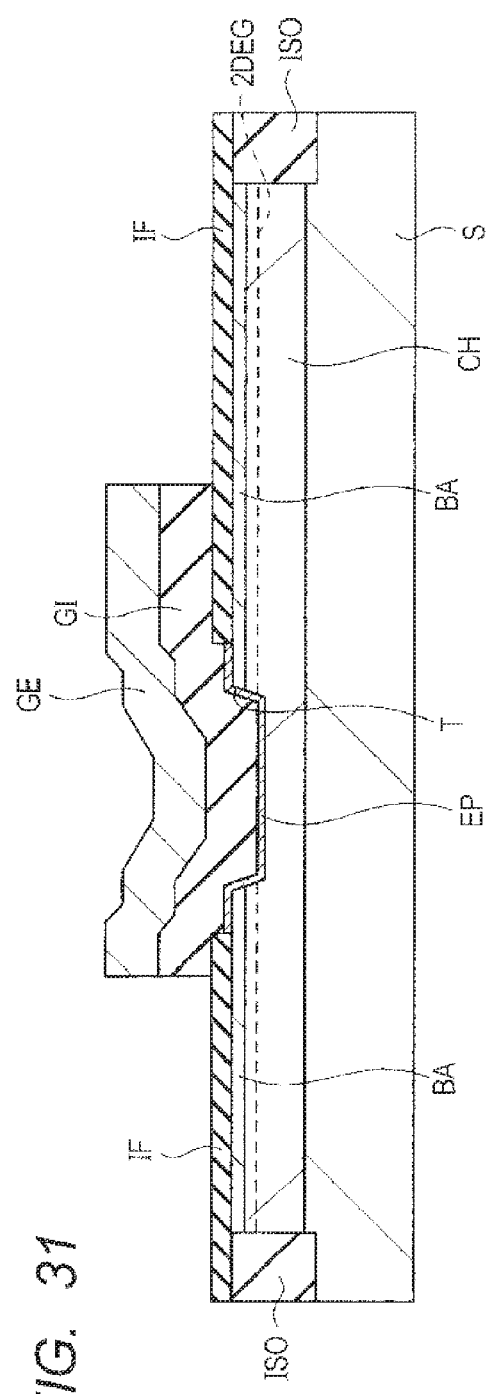
FIG. 31 is a cross-sectional view showing a manufacturing process of the semiconductor device of the second embodiment and is a cross-sectional view showing a manufacturing process following that in FIG. 30.

Subsequently, as shown in FIG. 31, the gate insulating film GI and the gate electrode GE are formed over the epitaxial regrowth layer EP and the insulating film IF. The gate insulating film GI and the gate electrode GE can be formed in the same manner as in the first embodiment by using the same materials as those used in the first embodiment.

Thereafter, in the same manner as in the first embodiment, the interlayer insulating film IL1, the source electrode SE, the drain electrode DE, and the protective insulating film PRO are formed (see FIG. 22).

The semiconductor device shown in FIG. 22 can be formed by the process described above. The process described above is an example, and the semiconductor device of the present embodiment may be manufactured by a process other than the process described above.

In the present embodiment, as described in the third embodiment, the film thickness of the epitaxial regrowth layer EP formed on the side surface of the trench T may be smaller than the film thickness of the epitaxial regrowth layer EP formed on the bottom surface of the trench T. In this case, the film thickness of the epitaxial regrowth layer EP formed over the exposed surface of the barrier layer BA may be approximately the same as the film thickness of the epitaxial regrowth layer EP formed on the bottom surface of the trench T.

Fourth Embodiment

In the present embodiment, examples of the shape of the trench T will be described.

Figure 32:
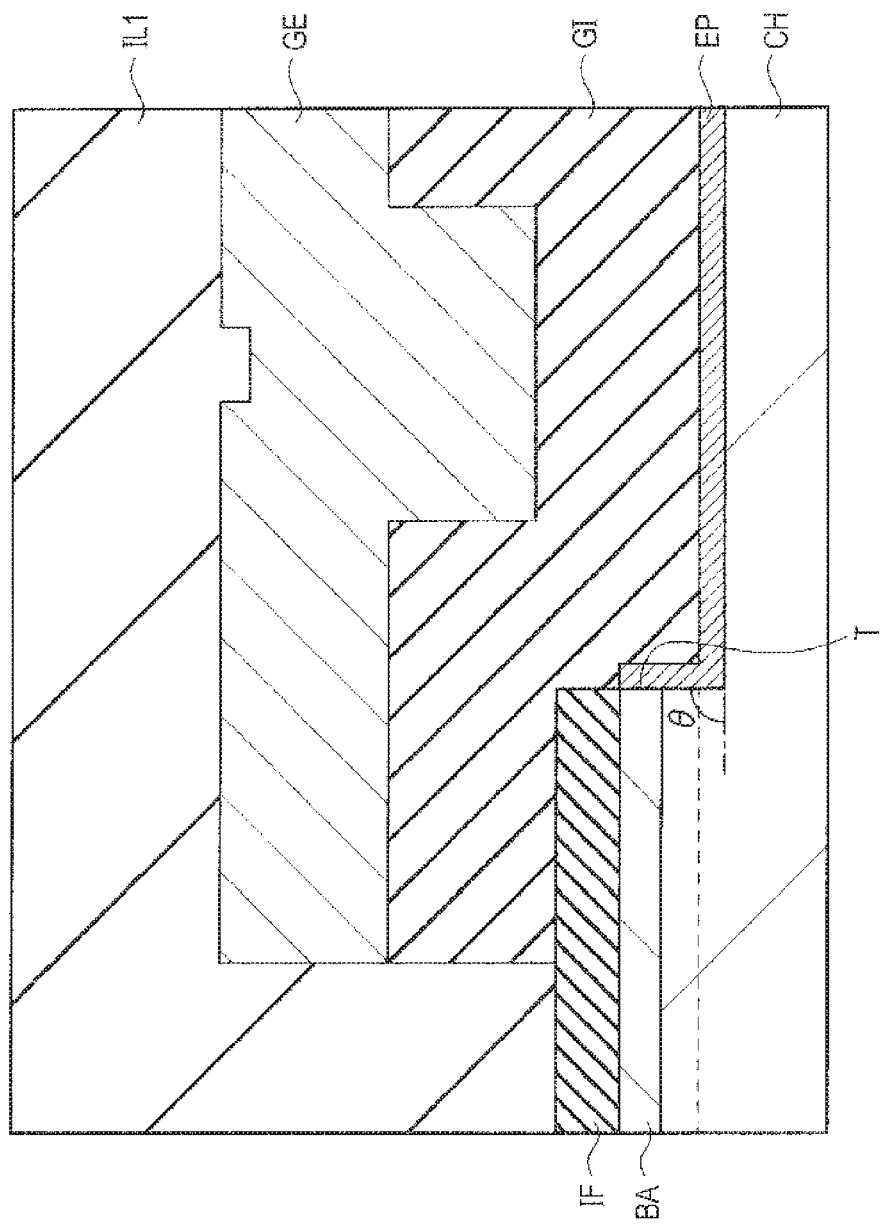
FIG. 32 is a cross-sectional view showing a first example of a configuration of a semiconductor device of a fourth embodiment.

FIG. 32 is a cross-sectional view showing a first example of a configuration of a semiconductor device of a fourth embodiment. As shown in FIG. 32, the inclination angle of the side surface of the trench T may be about 90 degrees. The inclination angle of the trench T here is an angle $\theta$ between the side surface of the trench T and a line extended from the bottom surface of the trench T. In the case of FIG. 32, $\theta$ is about 90 degrees. In the case of the first embodiment (FIG. 2), $\theta$ is smaller than 90 degrees.

Figure 33:
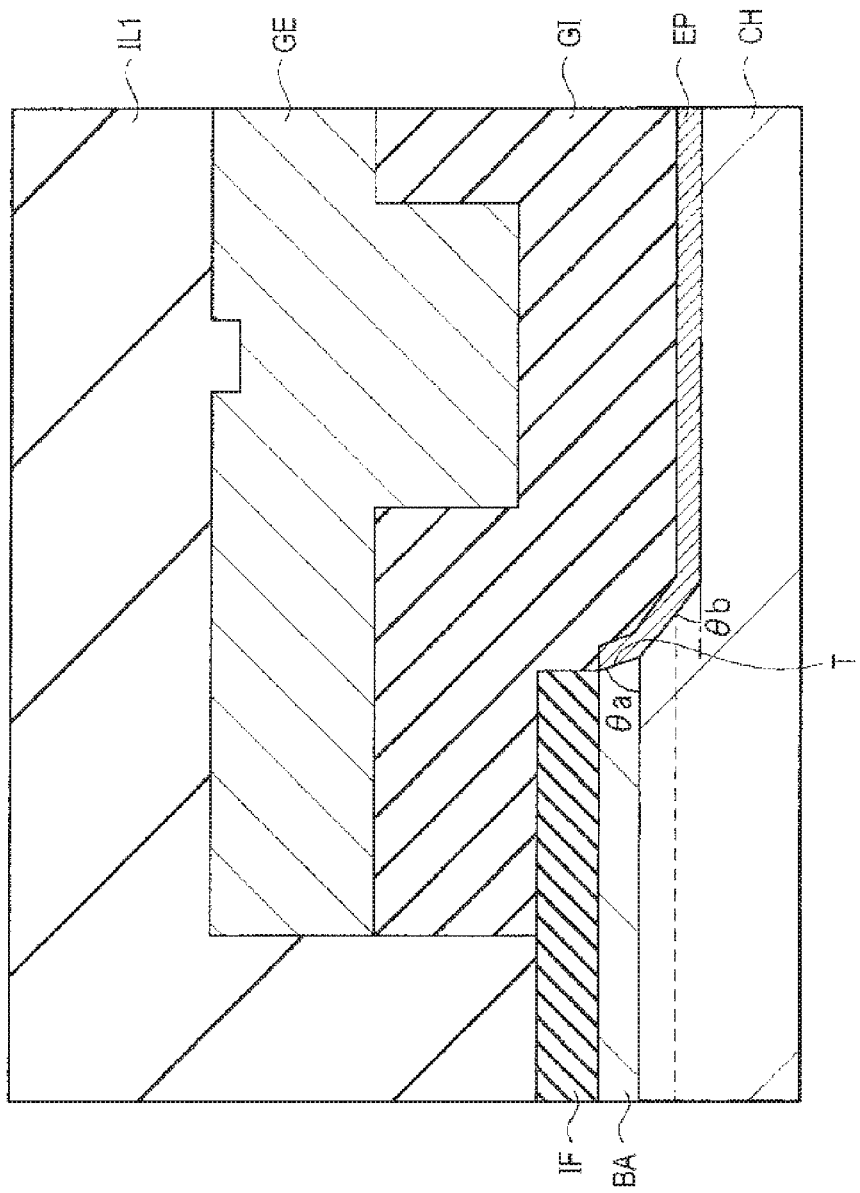
FIG. 33 is a cross-sectional view showing a second example of the configuration of the semiconductor device of the fourth embodiment.

FIG. 33 is a cross-sectional view showing a second example of the configuration of the semiconductor device of the present embodiment. As shown in FIG. 33, the inclination angle of the trench T may be changed between the side surface of the barrier layer BA and the side surface of the channel layer CH. Regarding an inclination angle of the trench T here, the inclination angle of the side surface of the barrier layer BA is an angle $\theta a$ between the side surface of the barrier layer BA and the bottom surface of the barrier layer BA. Further, regarding an inclination angle of the trench T, the inclination angle of the side surface of the channel layer CH is an angle $\theta b$ between the side surface of the channel layer CH and a line extended from the bottom surface of the trench T.

Figure 34:
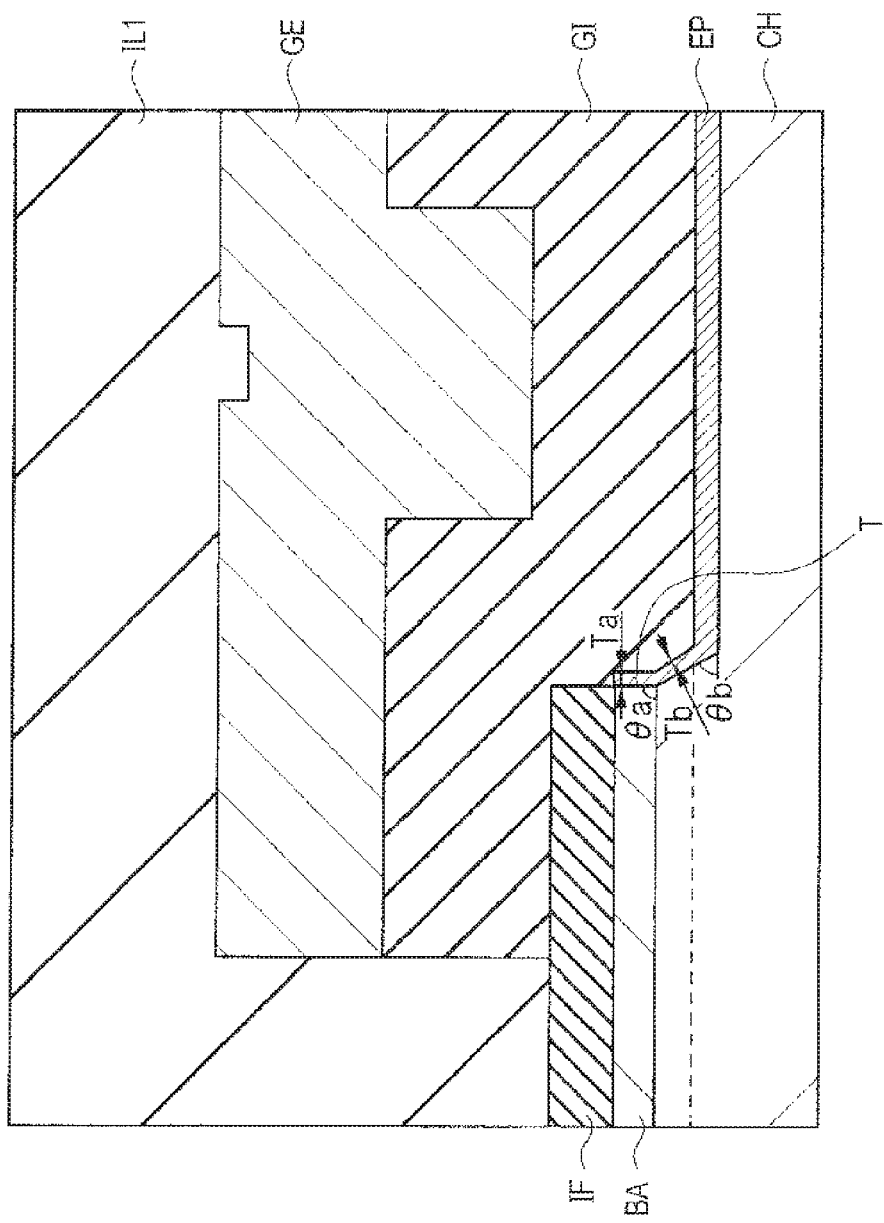
FIG. 34 is a cross-sectional view showing a third example of the configuration of the semiconductor device of the fourth embodiment.

FIG. 34 is a cross-sectional view showing a third example of the configuration of the semiconductor device of the present embodiment. As shown in FIG. 34, the inclination angle of the trench T is changed between the side surface of the barrier layer BA and the side surface of the channel layer CH, and further the film thickness of the epitaxial regrowth layer EP on the side surface of the barrier layer BA and the film thickness of the epitaxial regrowth layer EP on the side surface of the channel layer CH may be different from each other. In this case, the angle $\theta a$ between the side surface of the barrier layer BA and the bottom surface of the barrier layer BA is about 90 degrees, and the angle θb between the side surface of the channel layer CH and the line extended from the bottom surface of the trench T is smaller than 90 degrees. The film thickness Ta of the epitaxial regrowth layer EP on the side surface of the barrier layer BA is smaller than the film thickness (average film thickness) Tb of the epitaxial regrowth layer EP on the side surface of the channel layer CH. The shapes of the trench T in the first to the third examples are only examples, and the shape of the trench T is not limited to these shapes. The trench T having each shape shown by the first to the third examples can be formed by adjusting the condition of dry etching.

While the invention made by the inventors has been specifically described based on the embodiments, it is needless to say that the present invention is not limited to the embodiments and may be variously modified without departing from the scope of the invention. For example, the cap layer Cap described in the application example of the first embodiment may be applied to the other embodiments.

Further, for example, in the above embodiments, GaN is used as the channel layer, AlGaN is used as the barrier layer BA, and GaN is used as the cap layer Cap. However, the layers are not limited to these materials, and for example, InGaN may be used as the channel layer CH, AlInN may be used as the barrier layer BA, and InGaN may be used as the cap layer Cap when the cap layer Cap is used. In this way, a combination of materials used for the channel layer CH, the barrier layer BA, and the cap layer Cap can be arbitrarily adjusted in a range in which the functions of these layers are realized.

What is claimed is:

1. A manufacturing method of a semiconductor device, comprising:
   (a) forming a first nitride semiconductor layer over a substrate;
   (b) forming a second nitride semiconductor layer whose electron affinity is smaller than that of the first nitride semiconductor layer over the first nitride semiconductor layer;
   (c) forming an insulating film over the second nitride semiconductor layer;
   (d) forming a trench which penetrates the insulating film and the second nitride semiconductor layer and reaches inside of the first nitride semiconductor layer by etching the insulating film, the second nitride semiconductor layer, and the first nitride semiconductor layer;
   (e) forming a third nitride semiconductor layer over a side surface and a bottom surface of the trench by using an epitaxial growth method;
   (f) forming a gate insulating film over the third nitride semiconductor layer, and
   (g) forming a gate electrode over the gate insulating film,
   wherein a film thickness of the third nitride semiconductor layer formed in the step (e) over the side surface of the trench is smaller than a film thickness of the third nitride semiconductor layer over the bottom surface of the trench.

2. The manufacturing method of a semiconductor device according to claim 1, further comprising:
   between the step (b) and the step (c), (h) forming a fourth nitride semiconductor layer whose electron affinity is greater than that of the second nitride semiconductor layer over the second nitride semiconductor layer,
   wherein the step (d) is a step of forming the trench which penetrates the insulating film, the fourth nitride semiconductor layer, and the second nitride semiconductor layer and reaches inside of the first nitride semiconductor layer by etching the insulating film, the fourth nitride semiconductor layer, the second nitride semiconductor layer, and the first nitride semiconductor layer.

3. The manufacturing method of a semiconductor device according to claim 1, further comprising:
   between the step (d) and the step (e), (i) retreating an end portion of the insulating film from an end portion of the trench toward outside of the trench by etching a portion of the insulating film located at an outer circumferential portion of the trench,
   wherein the third nitride semiconductor layer in the step (e) is also formed over the second nitride semiconductor layer exposed from a retreated portion of the insulating film.

4. The manufacturing method of a semiconductor device according to claim 1,
   wherein at least a part of the side surface of the trench in the step (d) is inclined.

5. The manufacturing method of a semiconductor device according to claim 4,
   wherein in the side surface of the trench, an inclination angle of a side surface of the second nitride semiconductor layer and an inclination angle of a side surface of the first nitride semiconductor layer are different from each other.

6. The manufacturing method of a semiconductor device according to claim 5,
   wherein the inclination angle of the side surface of the second nitride semiconductor layer is greater than the inclination angle of the side surface of the first nitride semiconductor layer.

7. The manufacturing method of a semiconductor device according to claim 1,
   wherein a film thickness of the third nitride semiconductor layer is smaller than or equal to 10 nm.

8. A semiconductor device comprising:
   a first nitride semiconductor layer formed over a substrate;
   a second nitride semiconductor layer which is formed over the first nitride semiconductor layer and whose electron affinity is smaller than that of the first nitride semiconductor layer;
   an insulating film formed over the second nitride semiconductor layer;
   a trench which penetrates the insulating film and the second nitride semiconductor layer and reaches inside of the first nitride semiconductor layer;
   a third nitride semiconductor layer formed over a side surface and a bottom surface of the trench; and
   a gate electrode formed over the third nitride semiconductor layer through a gate insulating film,
   wherein the third nitride semiconductor layer is an epitaxial growth layer,
   wherein a film thickness of the third nitride semiconductor layer formed over the side surface of the trench is smaller than a film thickness of the third nitride semiconductor layer formed over the bottom surface of the trench.

9. The semiconductor device according to claim 8, further comprising:
   a fourth nitride semiconductor layer which is formed over the second nitride semiconductor layer and whose electron affinity is greater than that of the second nitride semiconductor layer,
   wherein the trench penetrates the insulating film, the fourth nitride semiconductor layer, and the second nitride semiconductor layer and reaches inside of the first nitride semiconductor layer.

10. The semiconductor device according to claim 8,
wherein an end portion of the insulating film is retreated from an end portion of the trench toward outside of the trench, and
wherein the third nitride semiconductor layer is also formed over the second nitride semiconductor layer exposed from a retreated portion of the insulating film.

11. The semiconductor device according to claim 8,
wherein at least a part of the side surface of the trench is inclined.

12. The semiconductor device according to claim 11,
wherein in the side surface of the trench, an inclination angle of a side surface of the second nitride semiconductor layer and an inclination angle of a side surface of the first nitride semiconductor layer are different from each other.

13. The semiconductor device according to claim 12,
wherein the inclination angle of the side surface of the second nitride semiconductor layer is greater than the inclination angle of the side surface of the first nitride semiconductor layer.

* * * * *